United States Patent
Morimoto

(10) Patent No.: US 6,842,015 B2
(45) Date of Patent: Jan. 11, 2005

(54) CAPACITANCE TYPE SENSOR

(75) Inventor: Hideo Morimoto, Yamatokooriyama (JP)

(73) Assignee: Nitta Corporation, Osaka (JP)

( * ) Notice: Subject to any disclaimer, the term of this patent is extended or adjusted under 35 U.S.C. 154(b) by 70 days.

(21) Appl. No.: 10/168,034

(22) PCT Filed: May 23, 2001

(86) PCT No.: PCT/JP01/04337
§ 371 (c)(1),
(2), (4) Date: Jun. 17, 2002

(87) PCT Pub. No.: WO02/073148
PCT Pub. Date: Sep. 19, 2002

(65) Prior Publication Data
US 2002/0190727 A1 Dec. 19, 2002

(30) Foreign Application Priority Data
Mar. 14, 2001 (JP) .......................... 2001-71682

(51) Int. Cl.[7] .............................................. G01R 27/26
(52) U.S. Cl. ................... 324/662; 324/661; 73/862.043
(58) Field of Search ................................. 324/658, 661, 324/662, 765; 367/776; 73/780, 862.043

(56) References Cited

U.S. PATENT DOCUMENTS

| | | | |
|---|---|---|---|
| 4,606,132 A | * 8/1986 | Briney et al. ............ | 33/366.14 |
| 5,367,199 A | 11/1994 | Lefkowitz et al. ........... | 307/116 |
| 6,464,411 B1 | * 10/2002 | Yoshida et al. .............. | 396/349 |
| 6,530,283 B2 | * 3/2003 | Okada et al. ................. | 73/780 |

FOREIGN PATENT DOCUMENTS

| | | | |
|---|---|---|---|
| JP | 11-132872 | 5/1999 | .............. G01L/1/14 |
| JP | 3069594 | 3/2000 | .......... H01H/13/52 |

OTHER PUBLICATIONS

International Preliminary Examination Report, dated Oct. 4, 2001, 3 pages.

* cited by examiner

Primary Examiner—Anjan K. Deb
Assistant Examiner—Walter Benson
(74) Attorney, Agent, or Firm—Osha & May L.L.P.

(57) ABSTRACT

A capacitance element electrode (E1) and a reference electrode (E31) are formed on a substrate (20) so as to be opposite to a displacement electrode (40). A dome-shaped movable switch electrode (E21) is disposed so as to be in contact with the reference electrode (E31) and at a distance from a fixed switch electrode (E11) formed inside the reference electrode (E31), and to cover the fixed switch electrode (E11). When an operation is applied to a detective member (30) and a portion of the movable switch electrode (E21) in the vicinity of its top is displaced to be brought into contact with fixed switch electrode (E11), a switch is turned ON. On the other hand, from a change in capacitance value of a capacitance element (C1) formed between the displacement electrode (40) and the capacitance element electrode (E1), the intensity of the force to the detective member (30) can be recognized.

22 Claims, 31 Drawing Sheets

CAPACITANCE TYPE SENSOR

TECHNICAL FIELD

The present invention relates to capacitance type sensors, in particular, suitably used for inputting operations in multidimensional directions and also usable as devices having switch functions.

BACKGROUND ART

A capacitance type sensor is generally used as a device for converting into an electric signal the intensity and direction of a force applied by an operator. For example, as an input device for a game machine used is a device incorporated as a capacitance type force sensor (so-called joy stick) for inputting operations in multidimensional directions.

Using the capacitance type sensor, an operation quantity with a predetermined dynamic range can be input as the intensity of a force applied by the operator. Such a sensor may be used in the form of a two-dimensional or three-dimensional force sensor capable of detecting each directional component divided from the applied force. In particular, a capacitance type sensor in which a capacitance element is made up of two electrodes and a force is detected on the basis of a change in capacitance value due to a change in interval of the electrodes has a merit that a cost reduction can be intended by simplifying the construction. Therefore, sensors of this type have been put in practical use in various fields.

For example, Japanese Patent Application Laid-open No. 7(1995)-200164 discloses a capacitance type sensor as illustrated in FIG. 30. The capacitance type sensor 510 is made up of a substrate 520, an elastic rubber sheet 530 provided on the substrate 520, an electrode 540 provided on the lower surface of the elastic rubber sheet 530, electrodes 500 to 504 (see FIG. 31) provided on the upper surface of the substrate 520, a holder plate 560 for supporting and fixing the elastic rubber sheet 530 to the substrate 520, and an electronic device 580 provided on the lower surface of the substrate 520. As illustrated in FIG. 31, the electrodes 500 to 504 are constituted by electrodes 501 and 502 disposed symmetrically in relation to Y axis, electrodes 503 and 504 disposed symmetrically in relation to X axis, and an annular electrode 500 disposed outside them. An outer peripheral portion of the electrode 540 is in contact with the electrode 500, which is grounded, so that the electrode 540 is also grounded through the electrode 500.

When an operator depresses the elastic rubber sheet 530, the electrode 540 is deformed downward in accordance with the depression force to change the respective distances between it and the four electrodes 501 to 504. The capacitance values of the respective capacitance elements formed between the four electrodes 501 to 504 and the electrode 540 change accordingly. Thus, by detecting the changes in capacitance values, the intensity and direction of the force applied by the operator can be known.

However, though the capacitance type sensor 510 illustrated in FIGS. 30 and 31 is suitable for use as a device (force sensor) for recognizing the intensity of the force when the operator depresses the elastic rubber sheet 530, it is unsuitable for use as a device having a switch function for switching between two different states (e.g., ON and OFF states). Therefore, in case of incorporating into an apparatus the capacitance type sensor 510 as a device having a switch function in each direction, it is hard to use the capacitance type sensor 510 in its original form and there is a necessity of provision of a separate switch function corresponding to each direction.

Accordingly, it is an object of the present invention to provide capacitance type sensors that can be used as either of devices for recognizing the intensity of a force in each direction and devices having switch functions.

DISCLOSURE OF THE INVENTION

A capacitance type sensor of the present invention is characterized by comprising a substrate for determining an XY plane in a defined XYZ three-dimensional coordinate system; a detective member being opposite to said substrate; a conductive member disposed between said substrate and said detective member, said conductive member being displaceable in a Z-axis direction as said detective member is displaced in a Z-axis direction; a reference electrode formed on said substrate and electrically connected with said conductive member, said reference electrode being grounded or kept at a fixed potential; a first electrode formed on said substrate; a second electrode formed on said substrate to constitute a first capacitance element with said conductive member; and a third electrode disposed at a distance from said first electrode so that said third electrode can be brought into contact with said first electrode as said conductive member is displaced, and by being capable of recognizing at least one of the displacement of said detective member on the basis of a detection, using a signal input to said second electrode, of a change in capacitance value of said first capacitance element caused by a change in distance between said conductive member and said second electrode, and a judgment as to whether or not said first and third electrodes are in contact with each other.

By this construction, since the displacement of the detective member can be recognized by detecting a change in capacitance value of the first capacitance element caused by a change in distances between the conductive member and the second electrode, the intensity of a force externally applied to the detective member can be recognized. In addition, since it can be recognized whether or not the first and third electrodes are in contact with each other, this can be used as a switch function. Thus, the capacitance type sensor of the present invention can be used as a device having a function of outputting the displacement of the detective member (the intensity of a force externally applied to the detective member) as a signal (an analogue signal) or/and a device having a switch function. Therefore, the capacitance type sensor has a function as a complex device that can be used as either of the aforementioned devices, and there is no necessity of remaking it to meet both applications.

In the capacitance type sensor of the present invention, said third electrode may be in contact with said reference electrode. By this, wiring for the third electrode need not be provided separately.

The capacitance type sensor of the present invention may comprise said third electrode that is elastically deformed with a click feeling as said conductive member is displaced.

In order that the third electrode can be elastically deformed with a click feeling to be brought into contact with the first electrode, the third electrode is made of a member whose displacement speed toward the first electrode is (preferably rapidly) increased when an external force more than a certain value is applied to it, i.e., a member whose displacement speed toward the first electrode in case of an applied external force exceeding a predetermined value is larger than that in case of an external force smaller than the predetermined value (the displacement speed in this case may be zero).

By this construction, in case that the capacitance type sensor of the present invention is used as a device having a switch function, when an operation is applied to the detective member, the third electrode corresponding to the operation direction is elastically deformed with a click feeling to come into contact with the first electrode. Therefore, the operator can execute the operation with having the click feeling and so he or she can easily sensually grasp the execution of the operation. Particularly in case that the third electrode has a dome shape and the first electrode is disposed inside the third electrode, when the force applied through the conductive member reaches a predetermined value, a portion of the dome-shaped third electrode in the vicinity of its top is rapidly deformed in a concave state to come into contact with the first electrode. This can give the operator a distinct click feeling.

In the capacitance type sensor of the present invention, a second capacitance element may be formed between said reference electrode and said conductive member. By this construction, since the conductive member is, without being in direct contact, electrically coupled with the reference electrode that is grounded or kept at a fixed potential through a capacitive coupling, the withstand voltage characteristic of the sensor is improved and the sensor is hardly broken due to the flow of a spark current. In addition, a bad condition in connection or the like can be prevented. Therefore, a highly reliable capacitance type sensor can be obtained. Besides, even in case of disposing an insulating film between the reference electrode and the conductive member, since there is no necessity of partially cutting the insulating film for bringing the reference electrode into contact with the conductive member, this is advantageous also in assembling and mounting.

The capacitance type sensor of the present invention is preferably provided with a plurality of electrode sets each constituted by a reference electrode as said reference electrode, a first electrode as said first electrode, a second electrode as said second electrode, and a third electrode as said third electrode. By this, the respective electrode sets can be used for recognizing forces in different directions, so a multi-dimensional force recognition can be realized. Further, this can be used as a device having switch functions corresponding to different directions.

In the capacitance type sensor of the present invention, two electrode sets each constituted by a reference electrode as said reference electrode, a first electrode as said first electrode, a second electrode as said second electrode, and a third electrode as said third electrode, may be provided, and signals different in phase from each other may be respectively input to a circuit including one of said electrode sets and a circuit including the other of said electrode sets. By this, the displacement of the detective member can be recognized irrespective of whether or not the circuit including one of said electrode sets and the circuit including the other of said electrode sets have the same time constant.

In the capacitance type sensor of the present invention, two electrode sets each constituted by a reference electrode as said reference electrode, a first electrode as said first electrode, a second electrode as said second electrode, and a third electrode as said third electrode, may be provided, and a CR circuit including one of said electrode sets may be different in time constant from a CR circuit including the other of said electrode sets. By this, since a wide difference in phase between signals by passing through the circuits can be obtained, the accuracy in displacement recognition for the detective member can be improved. Besides, the range capable of detecting the displacement of the detective member can be broadened.

In the capacitance type sensor of the present invention, two electrode sets each constituted by a reference electrode as said reference electrode, a first electrode as said first electrode, a second electrode as said second electrode, and a third electrode as said third electrode, may be provided, and output signals as a result of signals respectively input to a circuit including one of said electrode sets and a circuit including the other of said electrode sets are detected by a signal processing circuit using a logic element for performing one of an exclusive-OR operation, an OR operation, an AND operation, and an AND operation and a NOT operation. By this, the output signals can accurately be detected. Further, the detection accuracy can be controlled at need.

In the capacitance type sensor of the present invention, said detective member preferably has been divided so as to correspond to the respective groups of said reference electrode, said first electrode, and said third electrode, and said second electrode. By this construction, since an external force corresponding to an operation direction and an external force corresponding to a switch are distinctly separated, the interference between them can be relieved and erroneous operations can be reduced.

In the capacitance type sensor of the present invention, said second electrode may include a pair of fourth electrodes disposed symmetrically in relation to the Y axis, and a pair of fifth electrodes disposed symmetrically in relation to the X-axis. By this, the X-axis and Y-axis directional components of a force externally received by the detective member can be recognized separately.

In the capacitance type sensor of the present invention, said detective member preferably has been divided so as to correspond to said fourth electrodes and said fifth electrodes. By this construction, since the X-axis or Y-axis directional components of an external force are distinctly separated, the interference between the components in the different directions can be relieved and erroneous operations can be reduced.

The capacitance type sensor of the present invention may further comprises a sixth electrode formed on said substrate; and a seventh electrode disposed at a distance from said sixth electrode so that said seventh electrode can be elastically deformed to be brought into contact with said sixth electrode, as said conductive member is displaced. By this construction, in addition to the above-described effects obtained, further, since the sixth and seventh electrodes that can be brought into contact with each other by an operation of the detective member, a switch usable for, e.g., performing a determination operation for an input, can be added.

In the capacitance type sensor of the present invention, said detective member preferably has been divided so as to correspond to said second electrode and said sixth electrode. By this construction, since an external force corresponding to an operation direction and an external force corresponding to a determination operation are distinctly separated, the interference between those forces can be relieved and erroneous operations can be reduced.

In the capacitance type sensor of the present invention, said detective member is preferably covered with an insulating member. By this construction, in case of the detective member made of a metal, the surface of the detective member can be prevented from being exposed to air and oxidized.

The capacitance type sensor of the present invention may further comprises a light source disposed on said substrate; and a filmy member having a transparent region and a non-transparent region. In this case, said detective member may be transparent. By this construction, since a light emitted from the light source passes through the part corresponding to the transparent portion in a predetermined shape formed in the filmy member, and then reaches the detective member, when the detective member is viewed from the outside, only the part in the predetermined shape of the transparent portion can be illuminated. Thus, the position and operation directions of the detective member can easily be grasped. In particular, even when a device provided with the capacitive type sensor is used in a dark place, an appropriate operation can be applied to the detective member.

In the capacitance type sensor of the present invention, said conductive member is preferably transparent. By this construction, since the light emitted from the light source is easily introduced to the detective member, when the detective member is viewed from the outside, the part in the predetermined shape of the transparent region formed in the filmy member can be illuminated at a sufficient brightness.

The capacitance type sensor of the present invention may further comprises a colored member with transparency disposed between said light source and said detective member. By this, the color of the light illuminating only the part in the predetermined shape of the transparent portion when the detective member is viewed from the outside, can be changed.

In the capacitance type sensor of the present invention, said detective member is preferably covered with a transparent insulating member. By this construction, in case of the detective member made of a metal, the surface of the detective member can be prevented from being exposed to air and oxidized. Further, since a light emitted from the light source passes through the insulating member and then it is introduced to the outside, when the detective member is viewed from the outside, only the part in the predetermined shape of the transparent region can be illuminated

BEST MODE FOR CARRYING OUT THE INVENTION

Hereinafter, preferred embodiments of the present invention will be described with reference to drawings.

Figure 1:
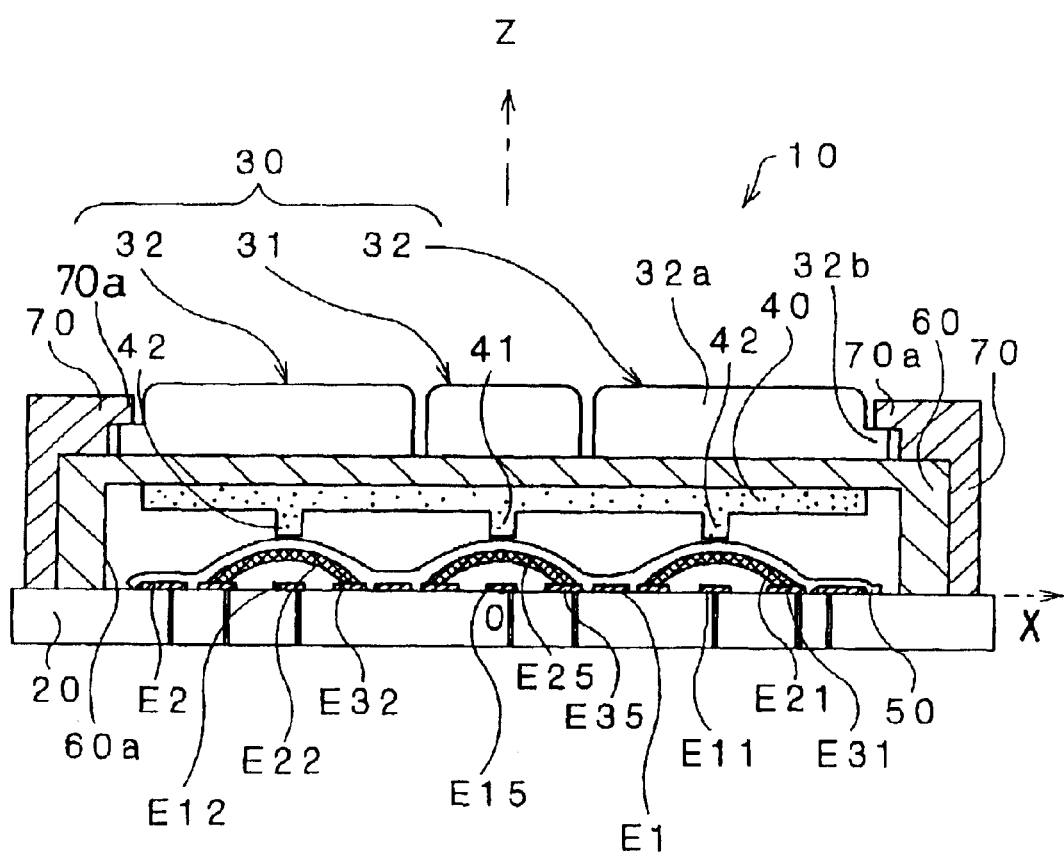
FIG. 1 is a schematic sectional view of a capacitance type sensor according to the first embodiment of the present invention.
Figure 2:
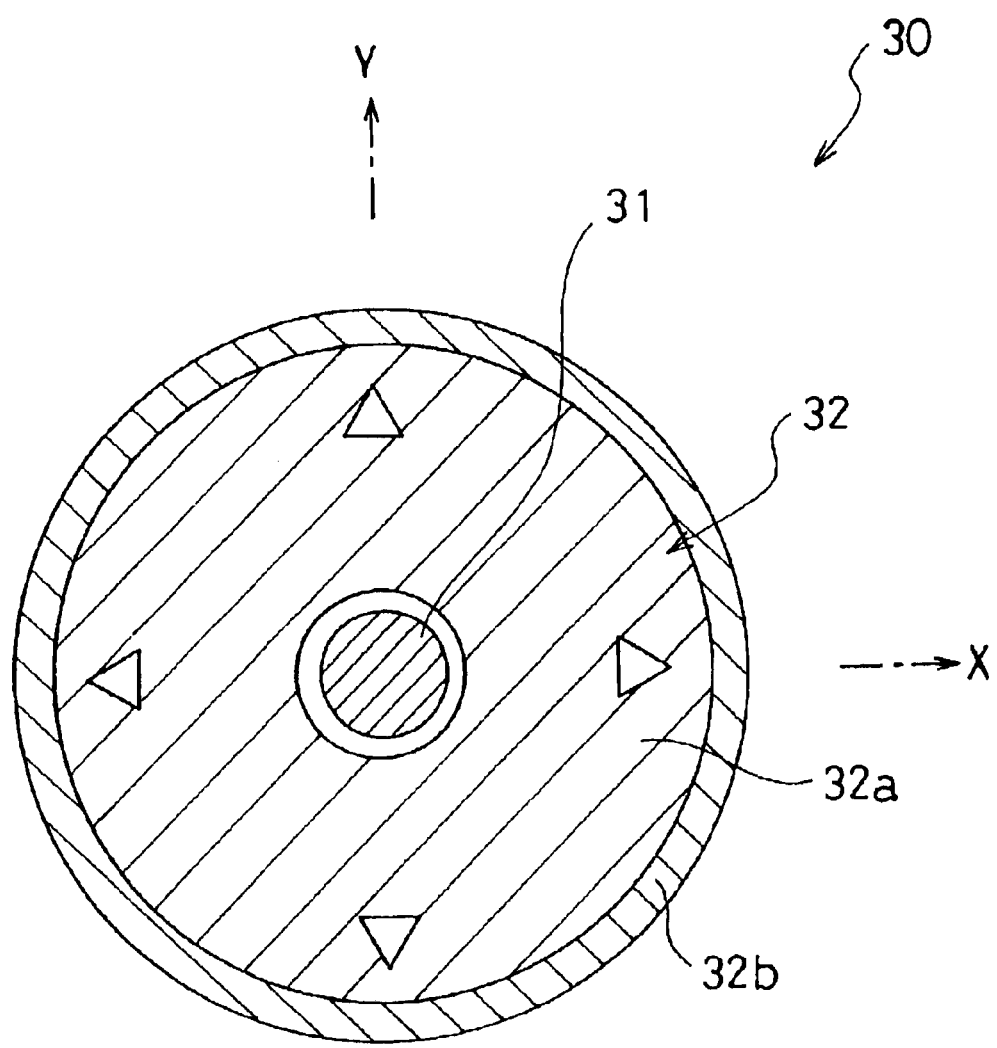
FIG. 2 is an upper view of a detective member of the capacitance type sensor of FIG. 1.
Figure 3:
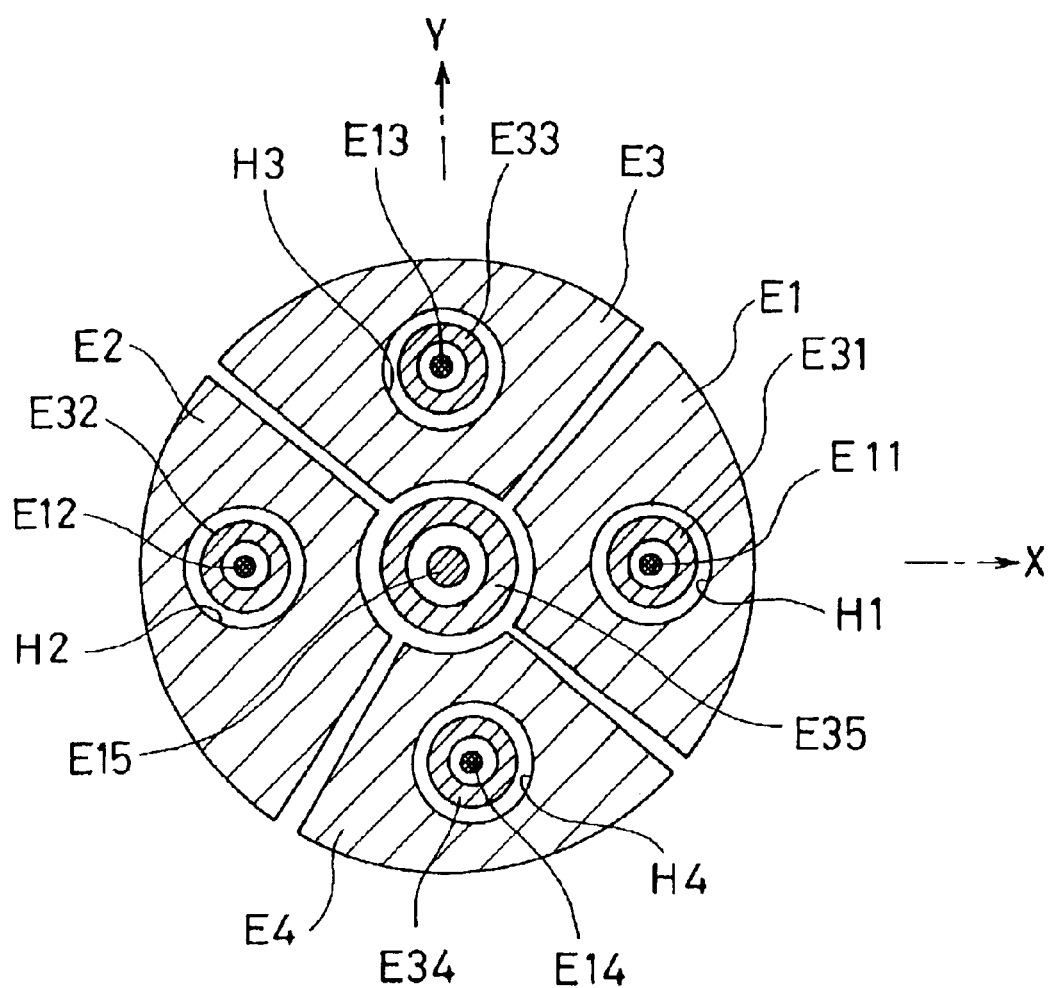
FIG. 3 is a view illustrating an arrangement of electrodes formed on a substrate of the capacitance type sensor of FIG. 1.

FIG. 1 is a schematic sectional view of a capacitance type sensor according to the first embodiment of the present invention. FIG. 2 is an upper view of a detective member of the capacitance type sensor of FIG. 1. FIG. 3 is a view illustrating an arrangement of electrodes formed on a substrate of the capacitance type sensor of FIG. 1.

The capacitance type sensor 10 includes a substrate 20, an operation detective member 30 to which a force is externally applied by being operated by a person or the like, a displacement electrode 40, capacitance element electrodes E1 to E4 formed on the substrate 20, movable switch electrodes E21 to E24 (FIG. 1 illustrates only E21 and E22) each having a dome shape, fixed switch electrodes E11 to E14 (FIG. 1 illustrates only E11 and E12) disposed inside the movable switch electrodes E21 to E24, a movable button electrode E25 having a dome shape, a fixed button electrode E15 disposed inside the movable button electrode E25, reference electrodes (a common electrode) E31 to E35, an insulating film 50 formed in close contact with some electrodes to partially cover the upper surface of the substrate 20, a supporting member 60 for supporting and fixing the detective member 30 and the displacement electrode 40 to the substrate 20, and a cover case 70 disposed so as to cover peripheral portions of the supporting member 60 and the detective member 30.

For convenience of explanation, an XYZ three-dimensional coordinate system is defined as illustrated and the arrangement of the aforementioned components will be explained with reference to the coordinate system. That is, in FIG. 1, the origin O is set on the substrate 20 at the center of the fixed button electrode E15, the X axis is set so as to horizontally extend rightward, the Z axis is set so as to vertically extend upward, and the Y axis is set so as to extend backward perpendicularly to FIG. 1. Thus, the upper surface of the substrate 20 is on the XY plane and the Z axis extends through the respective centers of the fixed button electrode E15 on the substrate 20, the detective member 30, and the displacement electrode 40.

The substrate 20 may be a general printed circuit board for an electronic circuit. In this embodiment, a glass epoxy board is employed. Otherwise, a filmy substrate such as a polyimide film may be used as the substrate 20. However, such a filmy substrate may be too flexible, so it is preferably disposed on a sufficiently rigid supporting board.

The detective member 30 is made up of a circular central button 31 whose center is at the origin, and a ring-shaped side button 32 disposed outside the central button 31. The diameter of the central button 31 is substantially equal to the outer diameter of the reference electrode E35. The side button 32 is made up of a small-diameter upper step portion 32a as a force-receiving portion and a large-diameter lower step portion 32b formed on the lower side of the upper step portion 32a. The diameter of the upper step portion 32a is substantially equal to the diameter of the circle determined by connecting the outer peripheral curves of the capacitance element electrodes E1 to E4, while the diameter of the lower step portion 32b is larger than the diameter of the circle determined by connecting the outer peripheral curves of the capacitance element electrodes E1 to E4. The central button 31 and the side button 32 are preferably made into separate bodies, though they may be made into one body.

The central button 31 is bonded to the upper surface of the supporting member 60 so as to be opposite to the movable button electrode E25, the fixed button electrode E15, and the reference electrode E35. The side button 32 is stopped by its lower step portion 32b abutting against a stopper portion 70a as a part of the cover case 70. The side button 32 is thereby disposed on the upper surface of the supporting member 60 with being prevented from coming off. The side button 32 may be bonded to the upper surface of the supporting member 60.

On the upper surface of the upper step portion 32a of the side button 32, as illustrated in FIG. 2, indicators corresponding to the respective operation directions (movement directions of a cursor) are provided so as to correspond to the positive and negative directions of the X and Y axes, i.e., to the capacitance element electrodes E1 to E4.

The supporting member 60 is a disk-shaped member having its diameter larger than the diameter of the circle determined by connecting the outer peripheral curves of the capacitance element electrodes E1 to E4. The supporting member 60 is made of an elastic silicone rubber. On the lower side of the supporting member 60 formed is a recess 60a open downward and having its diameter larger than the diameter of the circle determined by connecting the outer peripheral curves of the capacitance element electrodes E1 to E4. The supporting member 60 is disposed so that the part of the lower surface of the supporting member 60 other than the recess 60a is in contact with the substrate 20.

The displacement electrode 40 is made of a conductive silicone rubber. The displacement electrode 40 has a disk shape having its diameter substantially equal to the diameter of the circle determined by connecting the outer peripheral curves of the capacitance element electrodes E1 to E4. The displacement electrode 40 is attached to the lower surface of the supporting member 60 within the recess 60a. On the lower surface of the displacement electrode 40, a protrusion 41 is formed at the position opposite to the fixed button electrode E15 and four protrusions 42 are formed at the positions opposite to the respective fixed switch electrodes E11 to E14.

For the displacement electrode 40, other than the silicone rubber, a conductive ink, a conductive thermoplastic resin (PPT or elastomer), a conductive plastic, or a metallic deposit film may be used for example. Besides, the displacement electrode 40 may not be provided with the protrusions 41 and 42.

As illustrated in FIG. 3, on the substrate 20 formed are a circular fixed button electrode E15 whose center is at the origin O, a ring-shaped reference electrode E35 disposed outside the fixed button electrode E15, fan-shaped capacitance element electrodes E1 to E4 disposed outside the reference electrode E35 and having circular holes H1 to H4 at their respective substantially central portions, ring-shaped reference electrodes E31 to E34 disposed within the respective holes H1 to H4 and each having an outer diameter smaller than the diameter of the holes H1 to H4, and fixed switch electrodes E11 to E14 disposed inside the respective reference electrodes E31 to E34.

The capacitance element electrodes E1 and E2 in a pair are disposed at a distance from each other along the X axis and symmetrically in relation to the Y axis. Also, the capacitance element electrodes E3 and E4 in a pair are disposed at a distance from each other along the Y axis and symmetrically in relation to the X axis. In this embodiment, the capacitance element electrode E1 is disposed so as to correspond to the positive direction of the X axis while the capacitance element electrode E2 is disposed so as to correspond to the negative direction of the X axis. Thus, they are used for detecting the X-axis directional component of an external force. Also, the capacitance element electrode E3 is disposed so as to correspond to the positive direction of the Y axis while the capacitance element electrode E4 is disposed so as to correspond to the negative direction of the Y axis. Thus, they are used for detecting the Y-axis directional component of an external force.

The capacitance element electrodes E1 to E4, the fixed switch electrodes E11 to E14, the fixed button electrode E15, and the reference electrodes E31 to E35 are connected with terminals T1 to T4, T11 to T14, T15, and T31 to T35 (see FIG. 4) via through-holes or the like, respectively. They are connected with an external electronic circuit through those terminals. In this embodiment, the reference terminals E31 to E35 are grounded through the terminals T31 to T35.

Dome-shaped movable switch electrodes E21 to E24 are disposed so as to be in contact with the respective reference electrodes E31 to E34 and distant from the respective fixed switch electrodes E11 to E14 over the fixed switch electrodes E11 to E14. Therefore, each of the switch electrodes E21 to E24 has its diameter larger than the diameter of the holes H1 to H4. Also, a dome-shaped movable button electrode E25 is disposed which is in contact with the reference electrode E35 and distant from the fixed button electrode E15 over the fixed button electrode E15. Therefore, the movable button electrode E25 has its diameter larger than the inner diameter of the reference electrode E35.

The insulating film 50 is formed so as to be in close contact with the capacitance element electrodes E1 to E4 on the substrate 20, parts of the reference electrodes E31 to E35, and the movable switch electrodes E21 to E25 and to cover the corresponding part of the upper surface of the substrate 20. Therefore, the portions of the capacitance element electrodes E1 to E4, the reference electrodes E31 to E35, and the movable switch electrodes E21 to E25, which are made of copper or the like, covered with the insulating film 50, are never exposed to air. Thus, the insulating film 50 has a function of preventing them from being oxidized. Another measure for preventing oxidation such as formation of gold plating may be applied to the surfaces of the capacitance element electrodes E1 to E4, the reference electrodes E31 to E35, and the movable switch electrodes E21 to E25. Since the insulating film 50 is formed, the capacitance element electrodes E1 to E4, the reference electrodes E31 to E35, and the movable switch electrodes E21 to E24 never come into direct contact with the displacement electrode 40.

Figure 4:
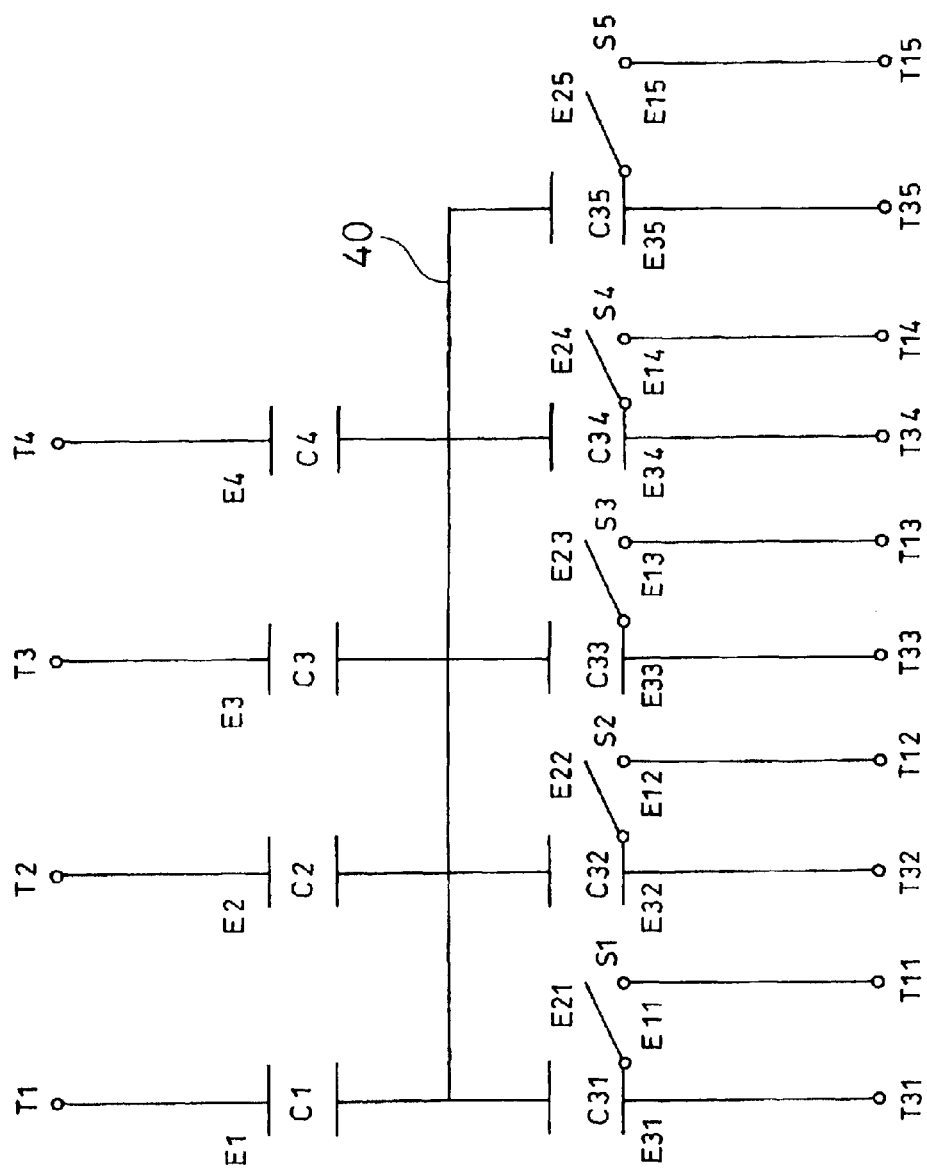
FIG. 4 is a circuit diagram equivalent to the construction of the capacitance type sensor illustrated in FIG. 1.

Next, the operation of the capacitance type sensor 10 according to this embodiment constructed as described above will be described with reference to a drawing. FIG. 4 is a circuit diagram equivalent to the construction of the capacitance type sensor illustrated in FIG. 1.

A circuit construction equivalent to the construction of the capacitance type sensor 10 will be described with reference to FIG. 4. The capacitance element electrodes E1 to E4 and the reference electrodes E31 to E35 formed on the substrate 20 are opposite to the displacement electrode 40. Capacitance elements C1 to C4 and C31 to C35 are formed between the deformable displacement electrode 40 as a common electrode and the respective fixed capacitance element electrodes E1 to E4 and reference electrodes E31 to E35. The capacitance elements C1 to C4 and C31 to C35 are variable capacitance elements whose capacitance values change due to the deformation of the displacement electrode 40.

The capacitance values of the capacitance elements C1 to C4 can be measured independently of one another as the capacitance values between the displacement electrodes 40 and the terminals T1 to T4 connected with the respective capacitance element electrodes E1 to E4. The reference electrodes E31 to E35 are grounded through the terminals T31 to T35, respectively. The displacement electrode 40 as the common electrode of the capacitance elements C1 to C4 is considered to be grounded through the capacitance elements C31 to C35 and the terminals T31 to T35. That is, the capacitance elements C31 to C35 make capacitive couplings between the displacement electrode 40 and the terminals T31 to T35.

The movable switch electrodes E21 to E24 connected with the reference electrodes E31 to E34 corresponding to the positive and negative directions of the X and Y axes can selectively take the positions in contact with the fixed switch electrodes E11 to E14 and positions not in contact with the fixed switch electrodes E11 to E14. Thus, the movable switch electrodes E21 to E24 have functions as switches S1 to S4 for connecting the reference electrodes E31 to E34 with the terminals T11 to T14 and disconnecting the former from the latter. Further, independently of the switches S1 to S4 corresponding to the four directions of the positive and negative directions of the X and Y axes, the movable switch electrode E25 connected with the reference electrode E35 can selectively take the position in contact with the fixed switch electrode E15 and a position not in contact with the fixed switch electrode E15, thereby having a function as a switch S5 for connecting the reference electrode E35 with the terminal T15 and disconnecting the former from the latter. Switch signals corresponding to the states of the switches S1 to S5 are output through the terminals T11 to T15, respectively.

Next, the operation of the capacitance type sensor 10 in case of being used as a device (force sensor) for detecting the intensity of a force applied to the detective member 30 will be described.

Figure 5:
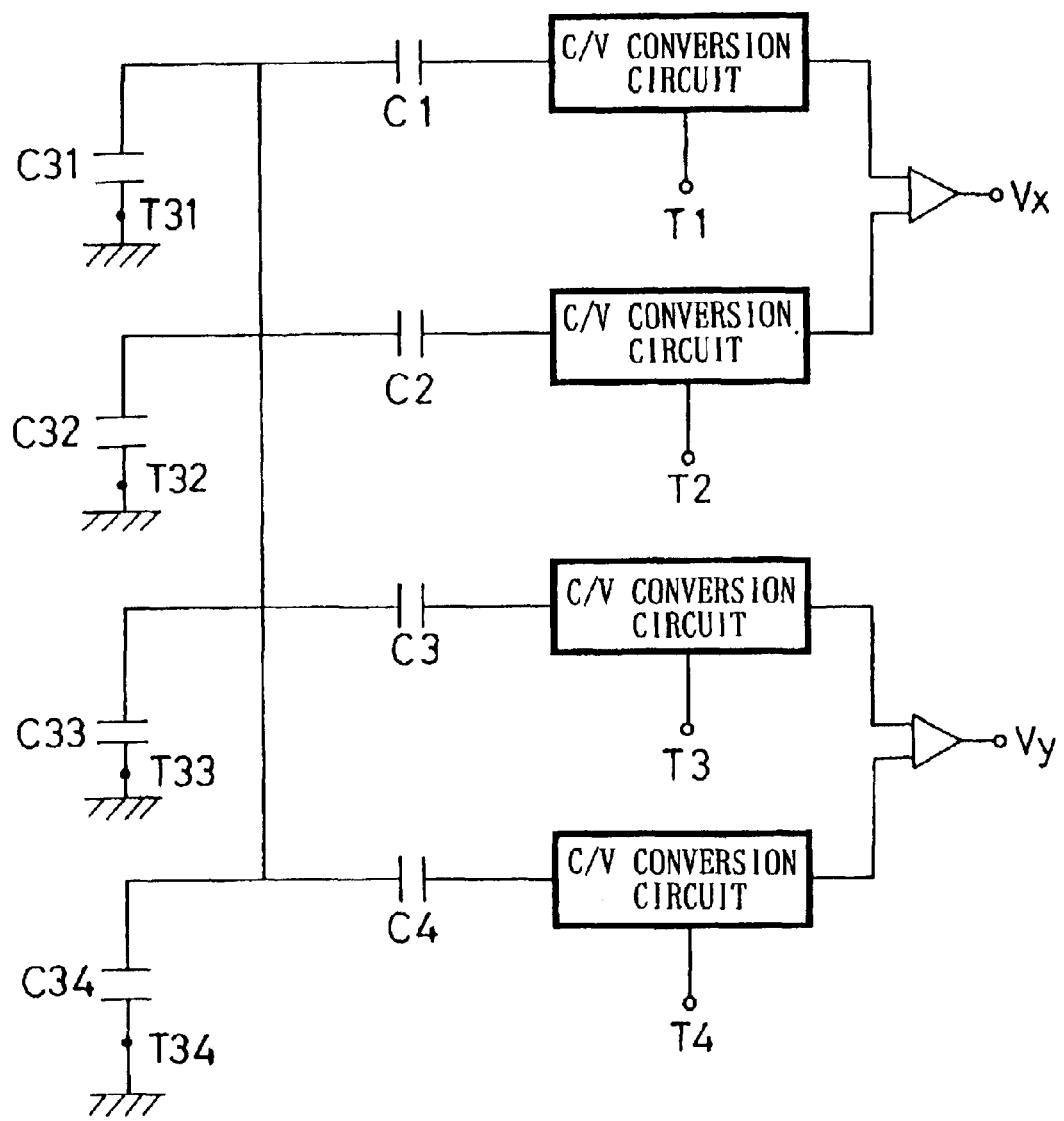
FIG. 5 is an explanatory diagram for explaining a method for deriving an output signal from a cyclic signal input to the capacitance type sensor illustrated in FIG. 1.

First, a deriving method of an output signal indicating the intensity and direction of an external force to the detective member 30, from a change in capacitance value of each of the capacitance elements C1 to C4 will be described with reference to a drawing. FIG. 5 is an explanatory diagram for explaining a method for deriving an output signal from a cyclic signal input to the capacitance type sensor illustrated in FIG. 1. Note that FIG. 5 illustrates only the necessary portion for explaining the method for deriving an output signal. Output signals $V_x$ and $V_y$ indicate the intensities and directions of the X-axis directional component and the Y-axis directional components of an external force, respectively.

For deriving the output signals $V_x$ and $V_y$ a cyclic signal such as a clock signal is always being input to each of the terminals T1 to T4. In relation to the cyclic signal being input to the terminal T1, two capacitance elements C1 and C31 are connected in series. Also, two capacitance elements C2 and C32 are connected in series in relation to the cyclic signal being input to the terminal T2, two capacitance elements C3 and C33 are connected in series in relation to the cyclic signal being input to the terminal T3, and two capacitance elements C4 and C34 are connected in series in relation to the cyclic signal being input to the terminal T4.

When the detective member 30 receives an external force and deforms in a state that the cyclic signals are being input to the terminals T1 to T4, the displacement electrode 40 accordingly deforms in a Z-axis direction. The distances of the electrodes of the capacitance elements C1 to C4 then change and the capacitance values of the respective capacitance elements C1 to C4 change. As a result, phase shifts in the cyclic signals being input to the terminals T1 to T4 occur. Using the phase shifts thus occurring in the cyclic signals, the output signals $V_x$ and $V_y$ can be obtained which indicate the deformation of the detective member 30, i.e., the intensities and directions in the X-axis direction and the Y-axis direction of the external force received by the detective member 30.

More specifically, when cyclic signals are being input to the terminals T1 to T4, a cyclic signal A is being input to the terminals T1 and t3, and another cyclic signal B having the same cycle as the cyclic signal A and different in phase from the cyclic signal A is being input to the terminals T2 and T4. In this case, when the detective member 30 receives an external force and the capacitance values of the respective capacitance elements C1 to C4 change, different quantities of phase shifts occur in the cyclic signal A or B being input to the terminals T1 to T4.

When the external force includes an X-axis positive component, the capacitance value of the capacitance element C1 change and it causes a phase shift in the cyclic signal A being input to the terminal T1. When the external force includes an X-axis negative component, the capacitance value of the capacitance element C2 change and it causes a phase shift in the cyclic signal B being input to the terminal T2. The quantities of the changes in capacitance value of the capacitance elements C1 and C2 correspond to the intensities of the X-axis positive and negative components of the external force, respectively. The phase shifts in the cyclic signals A and B being input to the terminals T1 and T2 are read by an exclusive-OR circuit to derive an output signal $V_x$. The sign of this output signal $V_x$ indicates whether the X-axis directional component of the external force is positive or negative, and the absolute value of the output signal $V_x$ indicates the intensity of the X-axis directional component.

When the external force includes a Y-axis positive component, the capacitance value of the capacitance element C3 change and it causes a phase shift in the cyclic signal A being input to the terminal T3. When the external force includes a Y-axis negative component, the capacitance value of the capacitance element C4 change and it causes a phase shift in the cyclic signal B being input to the terminal T4. The quantities of the changes in capacitance value of the capacitance elements C3 and C4 correspond to the intensities of the Y-axis positive and negative components of the external force, respectively. The phase shifts in the cyclic signals A and B being input to the terminals T3 and T4 are read by an exclusive-OR circuit to derive an output signal $V_y$. The sign of this output signal $V_y$ indicates whether the Y-axis directional component of the external force is positive or negative, and the absolute value of the output signal $V_y$ indicates the intensity of the Y-axis directional component.

In case of an external force including X-axis or Y-axis directional components, the external force includes both the X-axis positive and negative components or both the Y-axis positive and negative components. Now, a case of X direction will be described by way of example. When the intensities of the X-axis positive and negative components are equal to each other, the value of the output signal $V_x$ is substantially the same as that in case of the external force including no X-axis directional component (the detail will be described later). On the other hand, when the intensities of the X-axis positive and negative components are different from each other, the quantities of the phase shifts in the cyclic signals A and B being input to the terminals T1 and T2 are also different from each other. In this case, as described above, an output signal $V_x$ is derived by reading the phase shifts with the exclusive-OR circuit. The same applies to the case of deriving an output signal $V_y$ in relation to Y axis.

Figure 6:
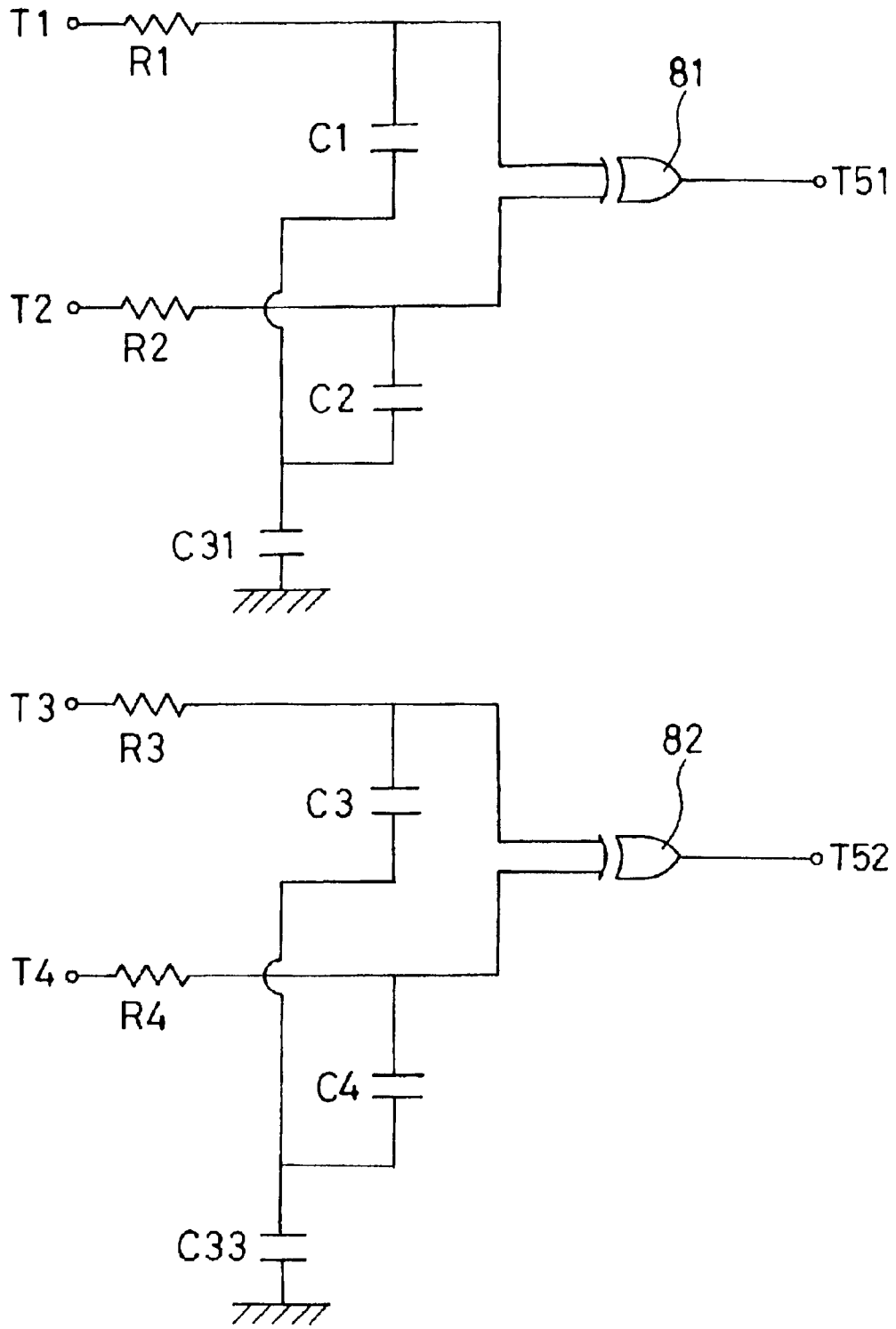
FIG. 6 illustrates circuit diagrams of signal processing circuits of the capacitance type sensor illustrated in FIG. 1.

Next, signal processing circuits for deriving output signals $V_x$ and $V_y$ from the cyclic signals A and B being input to the terminals T1 to T4 will be described with reference to drawings. FIG. 6 illustrates circuit diagrams of signal processing circuits of the capacitance type sensor illustrated in FIG. 1. Note that FIG. 6 illustrates only the necessary portions for explaining the signal processing circuits.

In the signal processing circuits illustrated in FIG. 6, cyclic signals of a predetermined frequency are being input to the terminals T1 to T4 from a not-illustrated AC signal oscillator. Resistance elements R1 to R4 are connected with the terminals T1 to T4, respectively. EX-OR elements 81 and 82 as logic elements in exclusive-OR circuits are connected with the output terminals of the resistance elements R1 and R2 and the output terminals of the resistance elements R3 and R4, respectively. The output terminals of the EX-OR elements 81 and 82 are connected with terminals T51 and T52, respectively. The output terminals of the resistance elements R1 to R4 are connected with the capacitance elements C1 to C4 formed between the capacitance element electrodes E1 to E4 and the displacement electrode 40, respectively. The displacement electrode 40 as one electrodes of the respective capacitance elements C1 and C2 is grounded through the capacitance element C31 formed between the displacement electrode 40 and the reference electrode E31. Also, the displacement electrode 40 as one electrodes of the respective capacitance elements C3 and C4 is grounded through the capacitance element C33 formed between the displacement electrode 40 and the reference electrode E33. Any of the capacitance elements C31 to C35 formed between the displacement electrode 40 and the reference electrodes E31 to E35 likewise has a function of grounding the displacement electrode 40.

Figure 7:
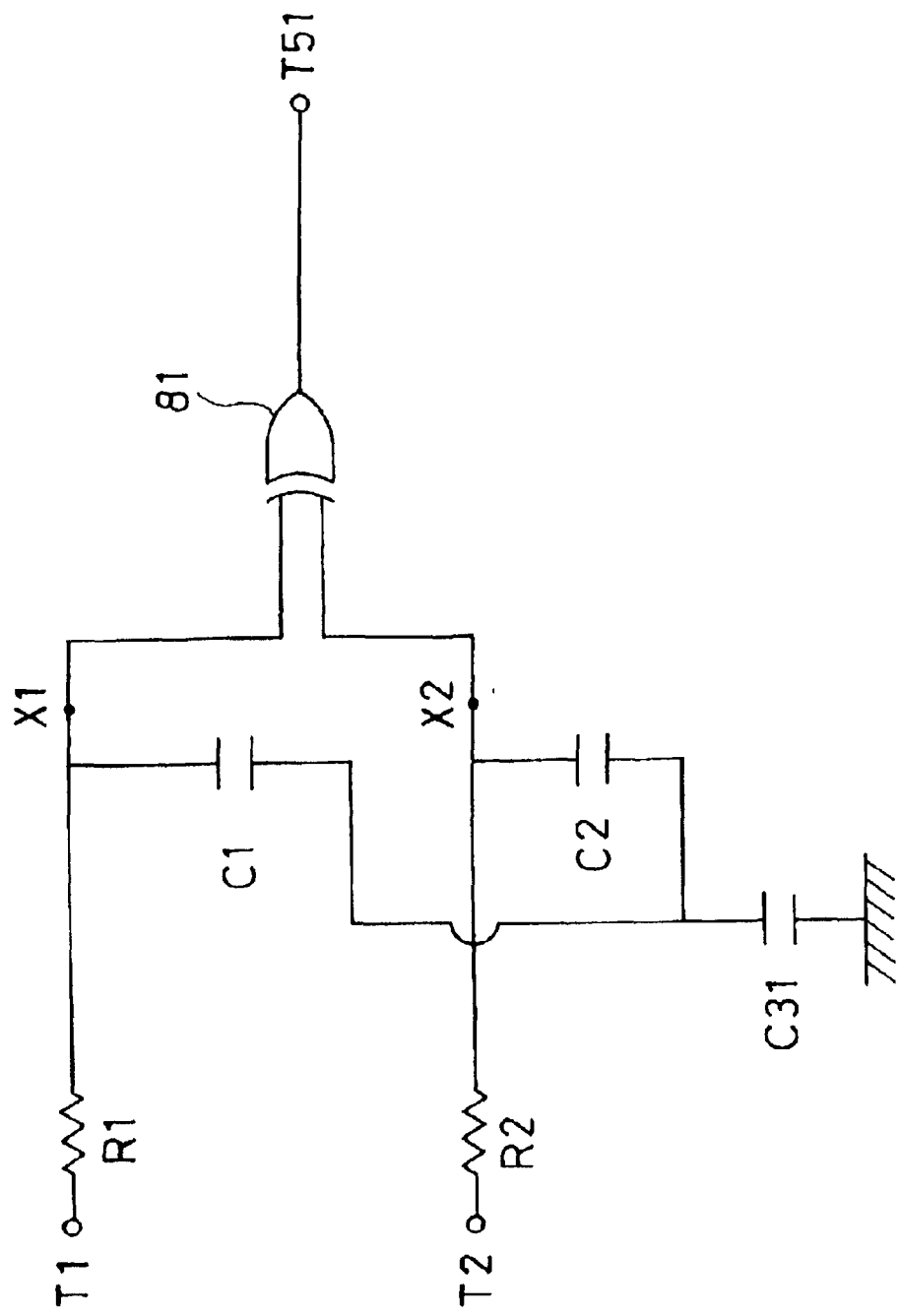
FIG. 7 is a circuit diagram of a signal processing circuit for X-axis directional component, in the capacitance type sensor illustrated in FIG. 1.

Hereinafter, a deriving method of an output signal $V_x$ for an X-axis directional component will be described by way of example with reference to FIG. 7. The description of a deriving method of an output signal $V_y$ for a Y-axis directional component will be omitted because it is similar to the below description. FIG. 7 is a circuit diagram of a signal processing circuit (part of FIG. 6) for X-axis directional component, in the capacitance type sensor illustrated in FIG. 1. In this signal processing circuit, the capacitance element C1 and the resistance element R1 forms a CR delay circuit and the capacitance element C2 and the resistance element R2 forms another CR delay circuit. Cyclic signals (rectangular wave signals) being input to the terminals T1 and T2 suffer predetermined delays due to the respective CR delay circuits and then unites in the EX-OR element 81.

If signals each having a sufficient driving ability can not be input to the terminals T1 and T2, inverter elements are preferably inserted between the terminal T1 and the resistance element R1 and between the terminal T2 and the resistance element R2. Such inverter elements are for producing sufficient driving powers for driving the CR delay circuits, and they are logically meaningless elements. When the same element is used for the inverter elements, signals in different paths can be compared under the same conditions.

Figure 8:
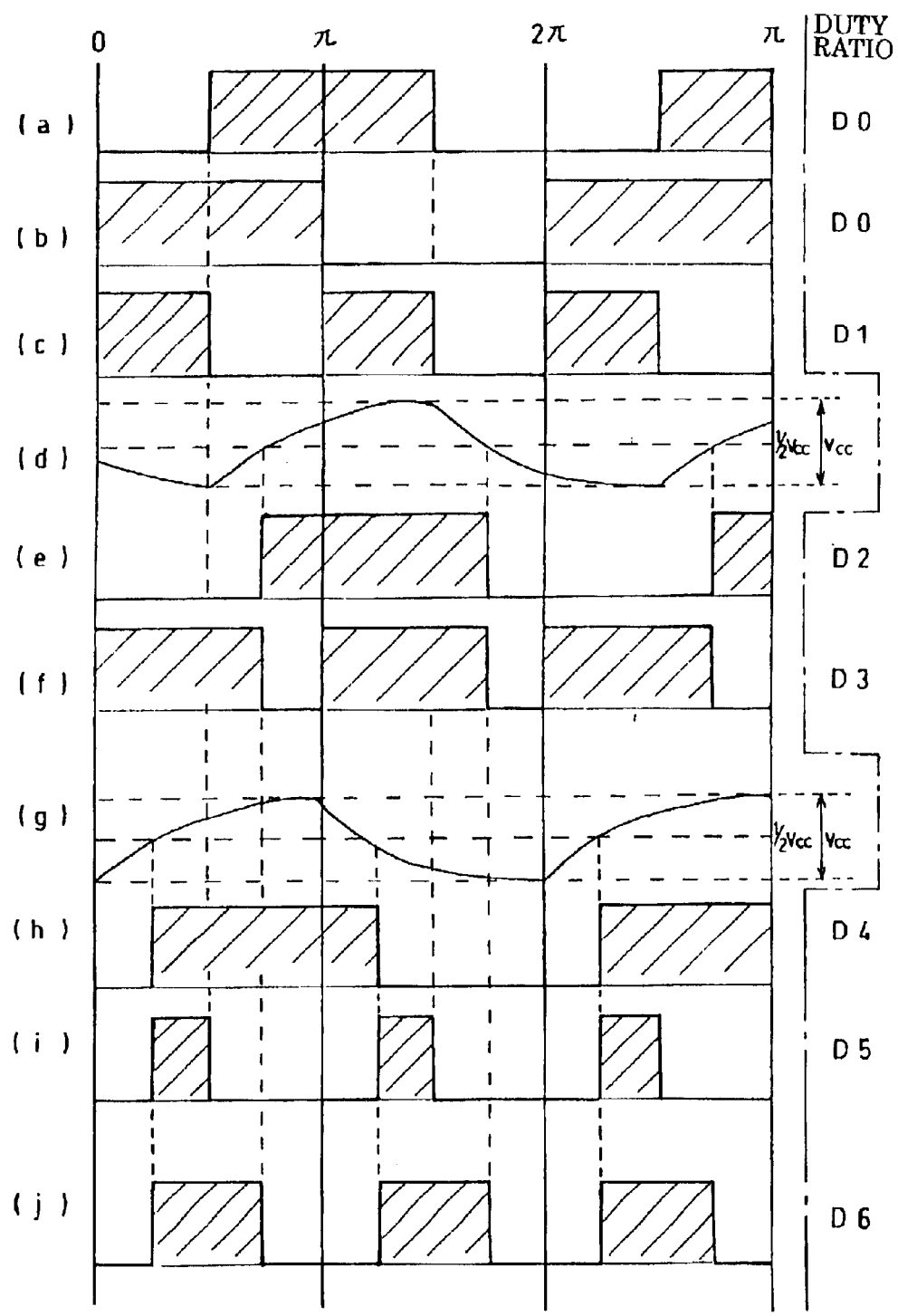
FIG. 8 is a chart illustrating the waveform of a cyclic signal at each terminal or node of the signal processing circuit illustrated in FIG. 7.

Next, the operation of the circuit of FIG. 7 will be described with reference to FIG. 8. FIG. 8 is a chart illustrating the waveform of a cyclic signal at each terminal or node of the signal processing circuit illustrated in FIG. 7.

In the signal processing circuit of FIG. 7, the cyclic signals being input to the terminals T1 and T2 suffer predetermined delays by passing through the CR delay circuits, and then enter the EX-OR element 81. More specifically, a cyclic signal $f(\phi)$ (which corresponds to the aforementioned cyclic signal A and will be referred to as cyclic signal A hereinafter) is input to the terminal T1, while a cyclic signal f(φ+θ) (which corresponds to the aforementioned cyclic signal B and will be referred to as cyclic signal B hereinafter) having the same cycle as the cyclic signal f(φ) and different in phase by θ is input to the terminal T2. Here will be described a case wherein the duty ratio D0 of the cyclic signal A is 50% and the phase of the cyclic signal B has advanced from the phase of the cyclic signal A by ¼ the cycle of the cyclic signal A.

The cyclic signals A and B different in phase to be input to the terminals T1 and T2 are generated in the manner that a cyclic signal output from one AC signal oscillator is divided into two paths and a not-illustrated CR delay circuit is provided in one of the paths so as to delay the phase of the cyclic signal having passed through the CR delay circuit. The method for making the phases of the cyclic signals different is not limited to such a method of using a CR delay circuit and it may be any other method. Besides, it is also possible that the cyclic signals A and B different in phase are generated using two AC signal oscillators and they are input to the terminals T1 and T2, respectively.

FIG. 8 illustrates in (a) and (b) the waveforms of the cyclic signals A and B being input to the terminals T1 and T2, respectively. When no external force is applied to the detective member 30 (no operation is performed), the cyclic signals A and B being input to the terminals T1 and T2 enter the EX-OR element 81 with little delays. Therefore, the signals having the same waveforms as the cyclic signals at the terminals T1 and T2 are being input to the EX-OR element 81, which performs an exclusive-OR logical operation to those signals and outputs the result to the terminal T51. The output signal $V_x$ output to the terminal T51 is a rectangular wave signal having a duty ratio D1, as illustrated in (c) of FIG. 8.

Next, when only an operation in the X-axis positive direction is applied to the detective member 30, the cyclic signal A being input to the terminal T1 is delayed by passing through the delay circuit made up of the capacitance element C1 and the resistance element R1, and then reaches a node X1. FIG. 8 illustrates in (d) a change in potential at the node X1 of the signal processing circuit illustrated in FIG. 7 when the cyclic signal A is being input to the terminal T1.

In case that a cyclic signal wherein signals "Hi" and "Lo" are repeated is being input to the terminal T1, the following changes in potential at the node X1 are repeated. That is, as illustrated in (d) of FIG. 8, when a signal "Hi" starts, the capacitance element C1 constituting the CR delay circuit is gradually charged and thereby the potential at the node X1 gradually rises, and when a signal "Lo" starts, the capacitance element C1 constituting the CR delay circuit is gradually discharged and thereby the potential at the node X1 gradually lowers.

Actually, the waveform of the potential at the node X1 is converted into a rectangular wave (pulse waveform) by passing through a comparator (not illustrated) having a predetermined threshold. This comparator outputs a signal "Hi" when the input signal is higher than the set threshold, and a signal "Lo" when the input signal is lower than the set threshold. In case that the EX-OR element 81 is a C-MOS type logic element, when the power supply voltage is Vcc, the threshold voltage of the comparator is preferably set at about Vcc/2. In this way, by passing through the comparator, the waveform of the potential at the node X1 is converted into a rectangular wave having a duty ratio D2, as illustrated in (e) of FIG. 8.

At this time, since the cyclic signal B being input to the terminal T2 is little delayed, the waveform of the cyclic signal having reached a node X2 is the same as that of the cyclic signal B (the waveform signal illustrated in (b) of FIG. 8).

Thus, the signals having the same waveforms as the cyclic signals at the nodes X1 and X2 (the waveform signals illustrated in (b) and (e) of FIG. 8) are being input to the EX-OR element 81, an exclusive-OR logical operation is performed to those signals, and the result is output to the terminal T51. The output signal $V_x$ output to the terminal T51 is a rectangular wave signal having a duty ratio D3 as illustrated in (f) of FIG. 8.

When the X-axis positive portion of the detective member 30 is further depressed, the distance between the displacement electrode 40 and the capacitance element electrode E1 is decreased and accordingly the capacitance value of the capacitance element C1 increases. This increases the phase shift (delay quantity) in the cyclic signal A having passed through the delay circuit and accordingly the duty ratio D3 of the output signal $V_x$ output to the terminal T51 increases.

Next, when only an operation in the X-axis negative direction is applied to the detective member 30, the cyclic signal B being input to the terminal T2 is delayed by passing through the delay circuit made up of the capacitance element C2 and the resistance element R2, and then reaches the node X2. FIG. 8 illustrates in (g) a change in potential at the node X2 of the signal processing circuit illustrated in FIG. 7 when the cyclic signal B is being input to the terminal T2.

In case that a cyclic signal wherein signals "Hi" and "Lo" are repeated is being input to the terminal T2, the following changes in potential at the node X2 are repeated. That is, as illustrated in (g) of FIG. 8, when a signal "Hi" starts, the capacitance element C2 constituting the CR delay circuit is gradually charged and thereby the potential at the node X2 gradually rises, and when a signal "Lo" starts, the capacitance element C2 constituting the CR delay circuit is gradually discharged and thereby the potential at the node X2 gradually lowers.

Actually, the waveform of the potential at the node X2 is converted into a rectangular wave (pulse waveform) by passing through a comparator (not illustrated) having a predetermined threshold. This comparator outputs a signal "Hi" when the input signal is higher than the set threshold, and a signal "Lo" when the input signal is lower than the set threshold. In case that the EX-OR element 81 is a C-MOS type logic element, when the power supply voltage is Vcc, the threshold voltage of the comparator is preferably set at about Vcc/2. In this way, by passing through the comparator, the waveform of the potential at the node X2 is converted into a rectangular wave having a duty ratio D4, as illustrated in (h) of FIG. 8.

At this time, since the cyclic signal A being input to the terminal T1 is little delayed, the waveform of the cyclic signal having reached the node X1 is the same as that of the cyclic signal A (the waveform signal illustrated in (a) of FIG. 8).

Thus, the signals having the same waveforms as the cyclic signals at the nodes X1 and X2 (the waveform signals illustrated in (a) and (h) of FIG. 8) are being input to the EX-OR element 81, an exclusive-OR logical operation is performed to those signals, and the result is output to the terminal T51. The output signal $V_x$ output to the terminal T51 is a rectangular wave signal having a duty ratio D5 as illustrated in (i) of FIG. 8.

When the X-axis negative portion of the detective member 30 is further depressed, the distance between the displacement electrode 40 and the capacitance element electrode E2 is decreased and accordingly the capacitance value of the capacitance element C2 increases. This increases the phase shift (delay quantity) in the cyclic signal B having passed through the delay circuit and accordingly the duty ratio D5 of the output signal $V_x$ output to the terminal T51 decreases.

In this way, the duty ratio D5 (see (i) of FIG. 8) of the output signal $V_x$ output to the terminal T51 when only an operation in the X-axis negative direction is applied to the detective member 30, is smaller than the duty ratio D2 (see (e) of FIG. 8) of the output signal $V_x$ output to the terminal T51 when only an operation in the X-axis positive direction is applied to the detective member 30.

When operations in the X-axis positive and negative directions are applied to the detective member 30 at once, the cyclic signals A and B being input to the terminals T1 and T2 pass through the delay circuit made up of the capacitance element C1 and the resistance element R1 and the delay circuit made up of the capacitance element C2 and the resistance element R2, respectively, and then reach the nodes X1 and X2. Thus, changes in potential at the nodes X1 and X2 in this case are as illustrated in (d) and (g) of FIG. 8.

Therefore, signals (waveform signals illustrated in (e) and (h) of FIG. 8) wherein the changes in potential at the nodes X1 and X2 (waveforms illustrated in (d) and (g) of FIG. 8) have been digitized with a predetermined threshold, are being input to the EX-OR element 81, an exclusive-OR logical operation is performed to those signals, and the result is output to the terminal T51. The output signal $V_x$ output to the terminal T51 is a rectangular wave signal having a duty ratio D6 as illustrated in (j) of FIG. 8.

In this way, the duty ratio D6 (see (j) of FIG. 8) of the output signal $V_x$ output to the terminal T51 when operations in the X-axis positive and negative directions are applied to the detective member 30 at once, is substantially the same as the duty ratio D1 (see (c) of FIG. 8) of the output signal $V_x$ output to the terminal T51 when no operation is applied to the detective member 30. But, those signals are different in phase from each other.

Figure 9:
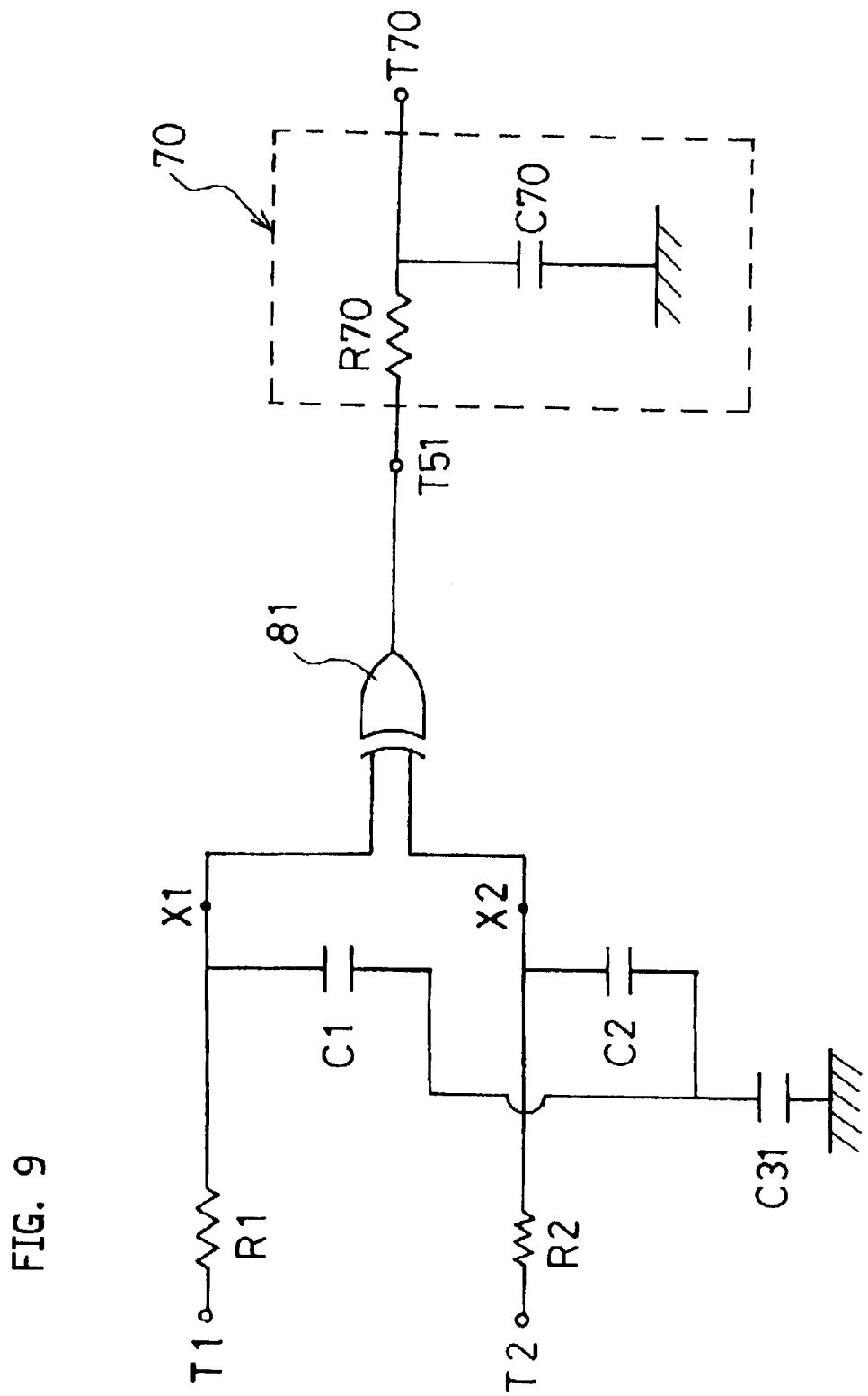
FIG. 9 is a circuit diagram of a signal processing circuit including a circuit for converting into an analogue voltage an output signal in relation to an X-axis directional component, in the capacitance type sensor illustrated in FIG. 1.

The output signal $V_x$ output to the terminal T51 can be used after being converted into an analogue voltage $V_x'$. FIG. 9 is a circuit diagram of a signal processing circuit including a circuit for converting into an analogue voltage an output signal in relation to an X-axis directional component, in the capacitance type sensor illustrated in FIG. 1.

As illustrated in FIG. 9, the output signal $V_x$ output to the terminal T51 passes through a low-pass filter made up of a resistance element R70 and a capacitance element C70 to be smoothed, and then output to a terminal 70 as an analogue voltage $V_x'$. The value of this analogue voltage $V_x'$ changes in proportion to the duty ratio of the output signal $V_x$. Thus, as the duty ratio of the output signal $V_x$ increases, the value of the analogue voltage $V_x'$ increases accordingly. Inversely, as the duty ratio of the output signal $V_x$ decreases, the value of the analogue voltage $V_x'$ decreases accordingly. If the duty ratio of the output signal $V_x$ little changes, then the value of the analogue voltage $V_x'$ also little changes.

Next, the operation of the capacitance type sensor 10 when being used as a device having a switch function (a switch signal output device) will be described. Here will be described only the operation when a portion of the detective member 30 corresponding to the X-axis positive direction is depressed. Since the operation when a portion of the detective member 30 corresponding to the X-axis negative direction, Y-axis positive direction, or Y-axis negative direction is depressed, is similar to the operation when the portion corresponding to the X-axis positive direction is depressed, the description thereof will be omitted.

While no operation is applied to the detective member 30, the movable switch electrode E21 and the fixed switch electrode E11 are distant from each other. Thus, the switch S1 is in its OFF state and a switch signal indicating the OFF state is being output through the terminal T11. When a portion of the detective member 30 corresponding to the X-axis positive direction is depressed, the protrusion 42 formed on the displacement electrode 40 to correspond to the X-axis positive direction is displaced downward. A downward force is then applied from the protrusion 42 through the insulating film 50 to a central portion of the movable switch electrode E21. If the force is less than a predetermined value, the movable switch electrode E21 little deforms. But, once the force reaches the predetermined value, a portion of the movable switch electrode E21 in the vicinity of its top is rapidly elastically deformed with buckling in a concave state to come into contact with the fixed switch electrode E11. The switch S1 is thereby turned ON with giving the operator a distinct click feeling. At this time, the switch signal being output through the terminal T11 is changed from the signal indicating the OFF state to a signal indicating the ON state.

In this way, by the operator depressing portions of the detective member 30 corresponding to the X-axis positive direction, X-axis negative direction, Y-axis positive direction, and Y-axis negative direction, four independent switch signals corresponding to the respective directions can be output.

In either of the cases that the capacitance type sensor 10 is used as the device for detecting the intensity of a force to the detective member 30 and the device having the switch function, by depressing the central button 31 to operate the switch S5 made up of the movable button electrode E25 and the fixed button electrode E15, an independent switch signal can be output through the terminal T15. Therefore, this can be used as a determination operation switch.

Also thinkable is a case wherein the capacitance type sensor 10 is used as both the device for detecting the intensity of a force to the detective member 30 and the device having the switch function. In this case, if a portion of the detective member 30 corresponding to the X-axis positive direction is depressed (by a force in a extent to keep a state that the movable switch electrode E21 and the fixed switch electrode E11 is distant from each other), in the OFF state of the switch S1, the distance between an X-axis positive portion of the displacement electrode 40 and the capacitance element electrode E1 changes to change the capacitance value of the capacitance element C1. From this change in capacitance value, the intensity of the force applied to the detective member 30 in the X-axis positive direction can be recognized. When the force reaches a predetermined value, a portion of the movable switch electrode E21 in the vicinity of its top is rapidly elastically deformed with buckling to be in a concave state and come into contact with the fixed switch electrode E1. The switch S1 is thereby turned ON. After this, if the detective member 30 is successively deformed, the displacement electrode 40 is further deformed with keeping the ON state of the switch S1 and thereby the distance between an X-axis positive portion of the displacement electrode 40 and the capacitance element electrode E1 changes to change the capacitance value of the capacitance element C1. From this change in capacitance value, the intensity of the force applied to the detective member 30 in the X-axis positive direction is recognized.

As described above, in the capacitance type sensor 10 of this embodiment, since the displacement of the side button 32 of the detective member 30 can be recognized by detecting changes in capacitance value of the capacitance elements C1 to C4 caused by changes in distances between the displacement electrode 40 and the capacitance element electrodes E1 to E4, the intensity of a force externally applied to the side button 32 of the detective member 30 can be recognized. Besides, since it can be recognized whether or not the fixed switch electrodes E11 to E14 are in contact with the movable switch electrodes E21 to E24, this can be used as a switch function. Thus, the capacitance type sensor 10 can be used as a device having a function of outputting the displacement of the side button 32 of the detective member 30 as a signal (an analogue signal) or/and a device having a switch function. By this, the capacitance type sensor 10 has a function as a complex device that can be used as either of the aforementioned devices, and there is no necessity of remaking it to meet both applications.

In case of being used as a device having a switch function, when an operation is applied to the side button 32 of the detective member 30, the dome-shaped movable switch electrodes E21 to E24 corresponding to the operation direction are elastically deformed with a click feeling to come into contact with the fixed switch electrodes E11 to E14. Therefore, the operator can execute the operation with having the click feeling and so he or she can easily sensually grasp the execution of the operation. Besides, since the movable switch electrodes E21 to E24 and the movable button electrode E25 are arranged so that they can be brought into contact with the reference electrodes E31 to E35, separate wirings for the movable switch electrodes E21 to E24 and the movable button electrode E25 need not be provided.

A plurality of capacitance electrodes E1 to E4 are formed, and components in the X-axis directions and Y-axis directions of an external force received by the side button 32 of the detective member 30 can be recognized independently of one another. Since signals different in phase from each other are supplied to capacitance element electrodes in a pair (E1 and E2, and E3 and E4), phase shift by passing through a circuit can be made large. Further, since a signal processing circuit utilizing a logic element is used, the signal can accurately be detected. Besides, a plurality of movable switch electrodes E21 to E24 and a plurality of fixed switch electrodes E11 to E14 are formed to correspond to the X-axis directions and Y-axis directions, they can use as switches corresponding to different directions.

Since the displacement electrode 40 is, without being in direct contact, electrically coupled with the reference electrodes E31 to E35 that are grounded through capacitive couplings by the capacitance elements C31 to C35 (each having a function of a coupling capacitor), the withstand voltage characteristic of the capacitance type sensor 10 is improved and the sensor is hardly broken due to the flow of a spark current. In addition, a bad condition in connection or the like can be prevented. Therefore, a highly reliable capacitance type sensor can be obtained. Besides, although the insulating film 50 is disposed between the reference electrodes E31 to E35 and the displacement electrode 40, since there is no necessity of partially cutting the insulating film 50 for bringing the reference electrodes E31 to E35 into contact with the displacement electrode 40, this is advantageous also in assembling and mounting.

In addition, an input device provided with a determination operation switch (the central button 31) can be made, and upon a determination operation, a distinct operation feeling can be obtained, so an erroneous operation can be prevented. Besides, since the detective member 30 is divided into the central button 31 and the side button 32, an external force applied to the side button 32 to correspond to an operation direction and an external force applied to the central button 31 to correspond to a determination operation are distinctly separated, so an interference between those forces can be relieved and erroneous operations can be decreased. The capacitance type sensor of this construction is suitably used as an input device for a personal computer, a portable telephone, games, or the like.

Figure 10:
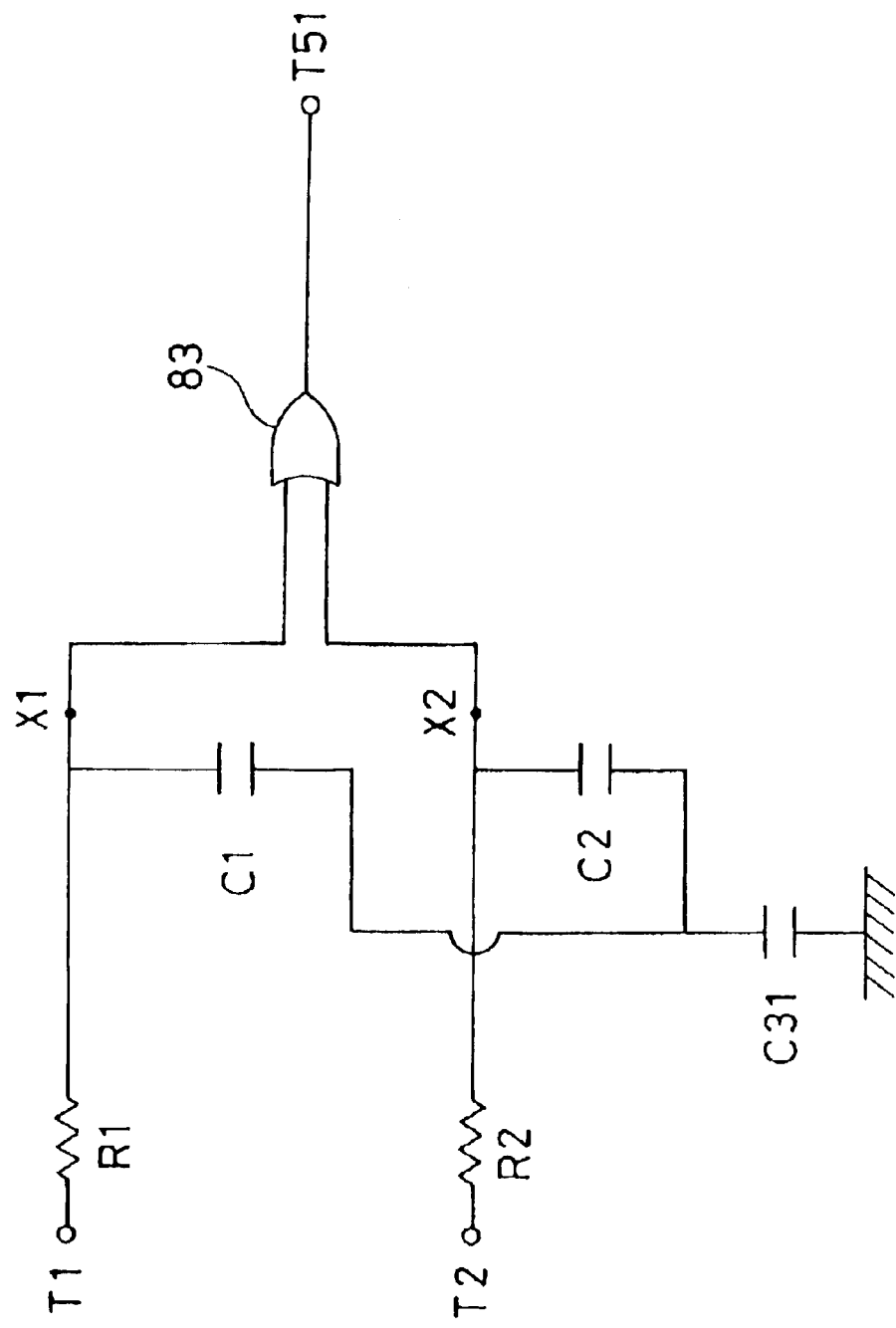
FIG. 10 is a circuit diagram of a signal processing circuit for X-axis directional component according to the first modification of the capacitance type sensor illustrated in FIG. 1.

Next, the first modification of the first embodiment of the present invention will be described with reference to a drawing. FIG. 10 is a circuit diagram of a signal processing circuit for X-axis directional component in the capacitance type sensor according to the first modification. The different feature of the signal processing circuit of FIG. 10 from the signal processing circuit of the capacitance type sensor of FIG. 1 is that an OR element is used as a logic element in place of the EX-OR element. The other construction is the same as that of the signal processing circuit of the capacitance type sensor of FIG. 1, so the description will be omitted by using the same references.

In FIG. 10, when an X-axis positive portion of the detective member 30 is depressed, the cyclic signal A being input to the terminal T1 passes through the CR delay circuit made up of the capacitance element C1 and the resistance element R1, and then reaches the node X1. At this time, the cyclic signal at the node X1 has a predetermined delay as illustrated in (e) of FIG. 8. Also, when an X-axis negative portion of the detective member 30 is depressed, the cyclic signal B being input to the terminal T2 passes through the CR delay circuit made up of the capacitance element C2 and the resistance element R2, and then reaches the node X2. At this time, the cyclic signal at the node X2 has a predetermined delay as illustrated in (h) of FIG. 8.

Therefore, like FIG. 7, signals having the same waveforms as the cyclic signals at the nodes X1 and X2 are being input to an OR element 83, an OR operation is performed to those signals, and the result is output to the terminal T51. The signal output to the terminal T51 is a rectangular wave signal having a predetermined duty ratio.

The change in duty ratio between the rectangular wave signal output to the terminal T51 in case of using the OR element 83 and the rectangular wave signal output to the terminal T51 when no operation is applied to the detective member 30 may be smaller than that of the rectangular wave signal output to the terminal T51 in case of using the EX-OR element. As a result, it is thinkable that the sensitivity of the capacitance type sensor may be lowered.

Therefore, this modification is preferably employed for controlling the sensitivity of the capacitance type sensor (for lowering the sensitivity in this example) by the construction of the signal processing circuit in case that each component of the capacitance type sensor is made of a material which brings about a very good sensitivity.

Figure 11:
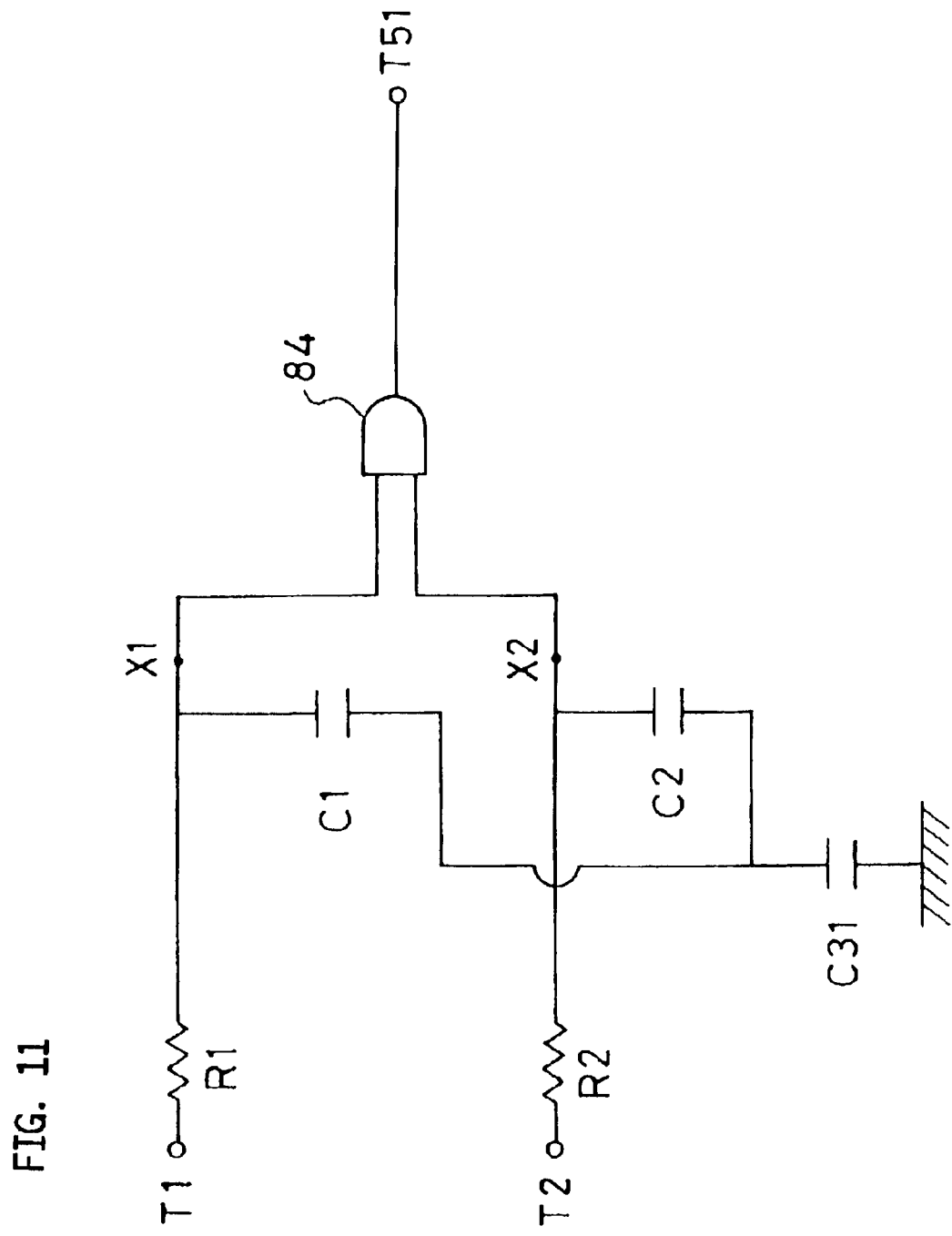
FIG. 11 is a circuit diagram of a signal processing circuit for X-axis directional component according to the second modification of the capacitance type sensor illustrated in FIG. 1.

Next, the second modification of the first embodiment of the present invention will be described with reference to a drawing. FIG. 11 is a circuit diagram of a signal processing circuit for X-axis directional component in the capacitance type sensor according to the second modification. The different feature of the signal processing circuit of FIG. 11 from the signal processing circuit of the capacitance type sensor of FIG. 1 is that an AND element is used as a logic element in place of the EX-OR element. The other construction is the same as that of the signal processing circuit of the capacitance type sensor of FIG. 1, so the description will be omitted by using the same references.

In FIG. 11, when an X-axis positive portion of the detective member 30 is depressed, the cyclic signal A being input to the terminal T1 passes through the CR delay circuit made up of the capacitance element C1 and the resistance element R1, and then reaches the node X1. At this time, the cyclic signal at the node X1 has a predetermined delay as illustrated in (e) of FIG. 8. Also, when an X-axis negative portion of the detective member 30 is depressed, the cyclic signal B being input to the terminal T2 passes through the CR delay circuit made up of the capacitance element C2 and the resistance element R2, and then reaches the node X2. At this time, the cyclic signal at the node X2 has a predetermined delay as illustrated in (h) of FIG. 8.

Therefore, like FIG. 7, signals having the same waveforms as the cyclic signals at the nodes X1 and X2 are being input to an AND element 84, an AND operation is performed to those signals, and the result is output to the terminal T51. The signal output to the terminal T51 is a rectangular wave signal having a predetermined duty ratio.

The change in duty ratio between the rectangular wave signal output to the terminal T51 in case of using the AND element 84 and the rectangular wave signal output to the terminal T51 when no operation is applied to the detective member 30 may be smaller than that of the rectangular wave signal output to the terminal T51 in case of using the EX-OR element. As a result, it is thinkable that the sensitivity of the capacitance type sensor may be lowered.

Therefore, this modification is preferably employed for controlling the sensitivity of the capacitance type sensor (for lowering the sensitivity in this example) by the construction of the signal processing circuit in case that each component of the capacitance type sensor is made of a material which brings about a very good sensitivity when being used as a capacitance type sensor.

Figure 12:
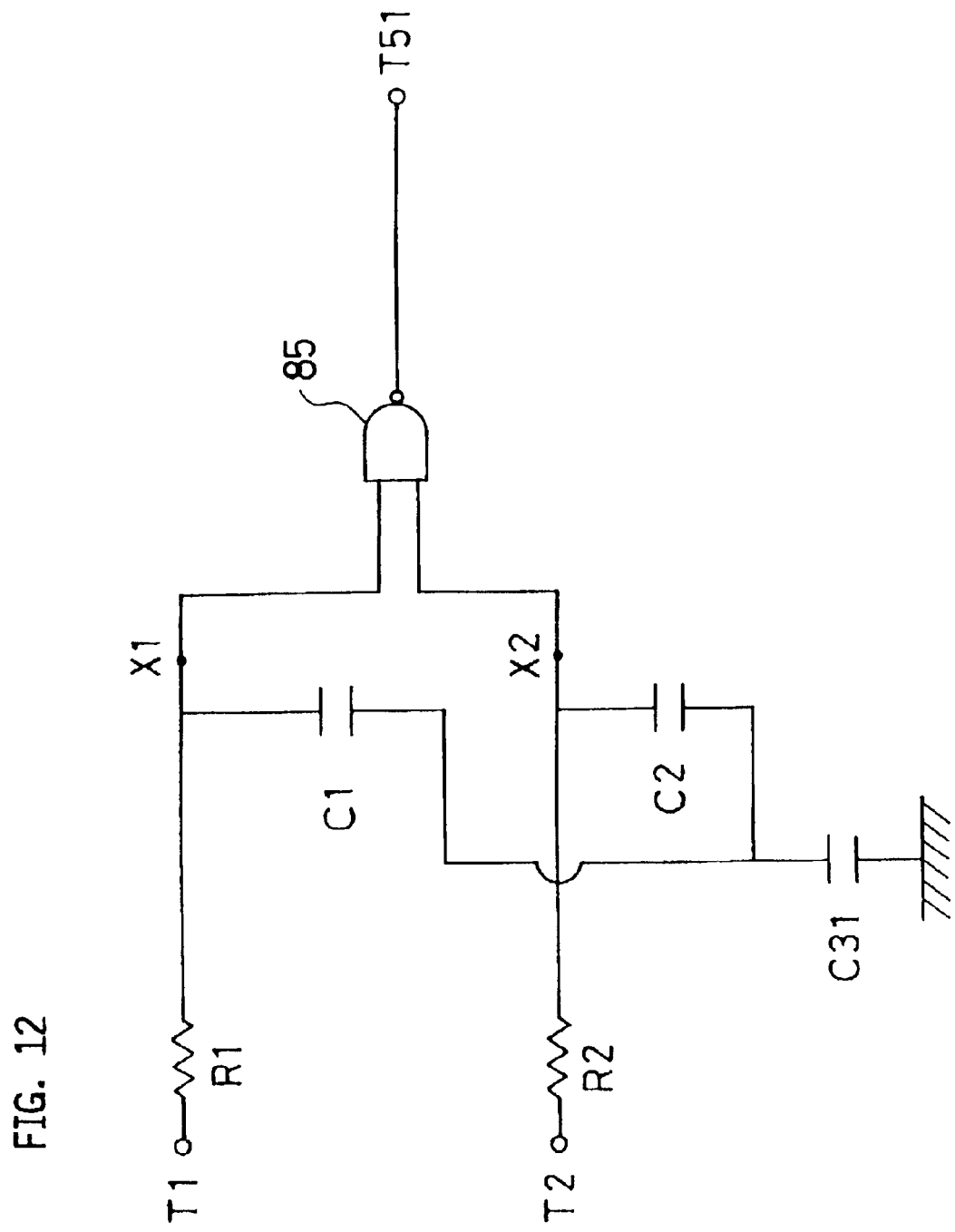
FIG. 12 is a circuit diagram of a signal processing circuit for X-axis directional component according to the third modification of the capacitance type sensor illustrated in FIG. 1.

Next, the third modification of the first embodiment of the present invention will be described with reference to a drawing. FIG. 12 is a circuit diagram of a signal processing circuit for X-axis directional component in the capacitance type sensor according to the second modification. The different feature of the signal processing circuit of FIG. 12 from the signal processing circuit of the capacitance type sensor of FIG. 1 is that a NAND element is used as a logic element in place of the EX-OR element. The other construction is the same as that of the signal processing circuit of the capacitance type sensor of FIG. 1, so the description will be omitted by using the same references.

In FIG. 12, when an X-axis positive portion of the detective member 30 is depressed, the cyclic signal A being input to the terminal T1 passes through the CR delay circuit made up of the capacitance element C1 and the resistance element R1, and then reaches the node X1. At this time, the cyclic signal at the node X1 has a predetermined delay as illustrated in (e) of FIG. 8. Also, when an X-axis negative portion of the detective member 30 is depressed, the cyclic signal B being input to the terminal T2 passes through the CR delay circuit made up of the capacitance element C2 and the resistance element R2, and then reaches the node X2. At this time, the cyclic signal at the node X2 has a predetermined delay as illustrated in (h) of FIG. 8.

Therefore, like FIG. 7, signals having the same waveforms as the cyclic signals at the nodes X1 and X2 are being input to a NAND element 85, an AND operation and subsequently a NOT operation are performed to those signals, and the result is output to the terminal T51. The signal output to the terminal T51 is a rectangular wave signal having a predetermined duty ratio.

The change in duty ratio between the rectangular wave signal output to the terminal T51 in case of using the NAND element 85 and the rectangular wave signal output to the terminal T51 when no operation is applied to the detective member 30 may be smaller than that of the rectangular wave signal output to the terminal T51 in case of using the EX-OR element. As a result, it is thinkable that the sensitivity of the capacitance type sensor may be lowered.

Therefore, this modification is preferably employed for controlling the sensitivity of the capacitance type sensor (for lowering the sensitivity in this example) by the construction of the signal processing circuit in case that each component of the capacitance type sensor is made of a material which brings about a very good sensitivity when being used as a capacitance type sensor.

Next, the second embodiment of the present invention will be described with reference to drawings.

Figure 13:
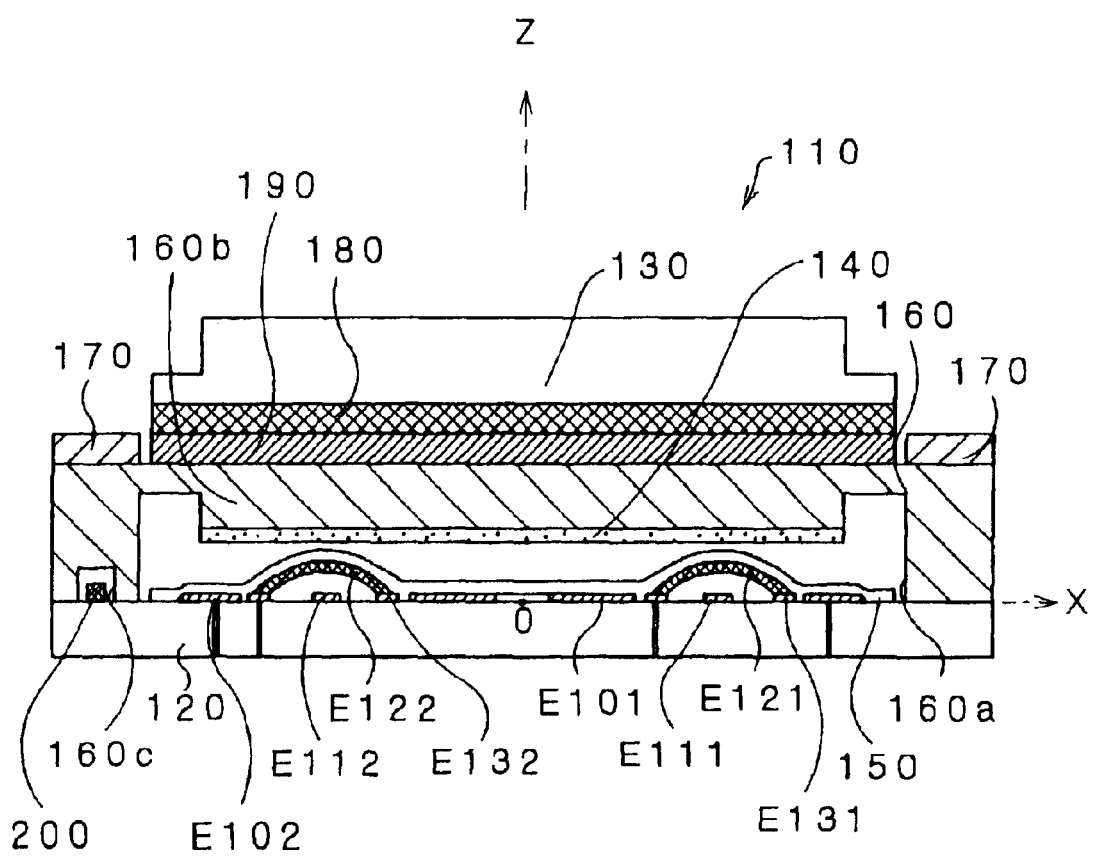
FIG. 13 is a schematic sectional view of a capacitance type sensor according to the second embodiment of the present invention.
Figure 14:
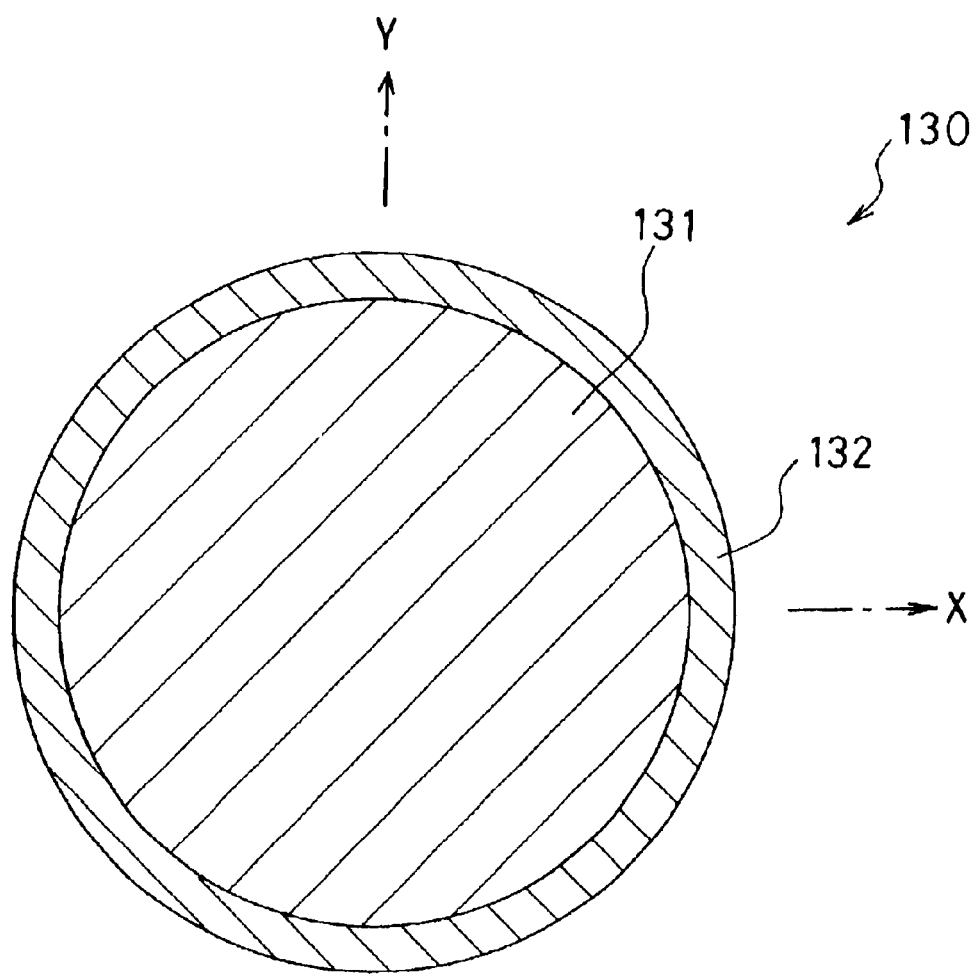
FIG. 14 is an upper view of a detective member of the capacitance type sensor of FIG. 13.
Figure 15:
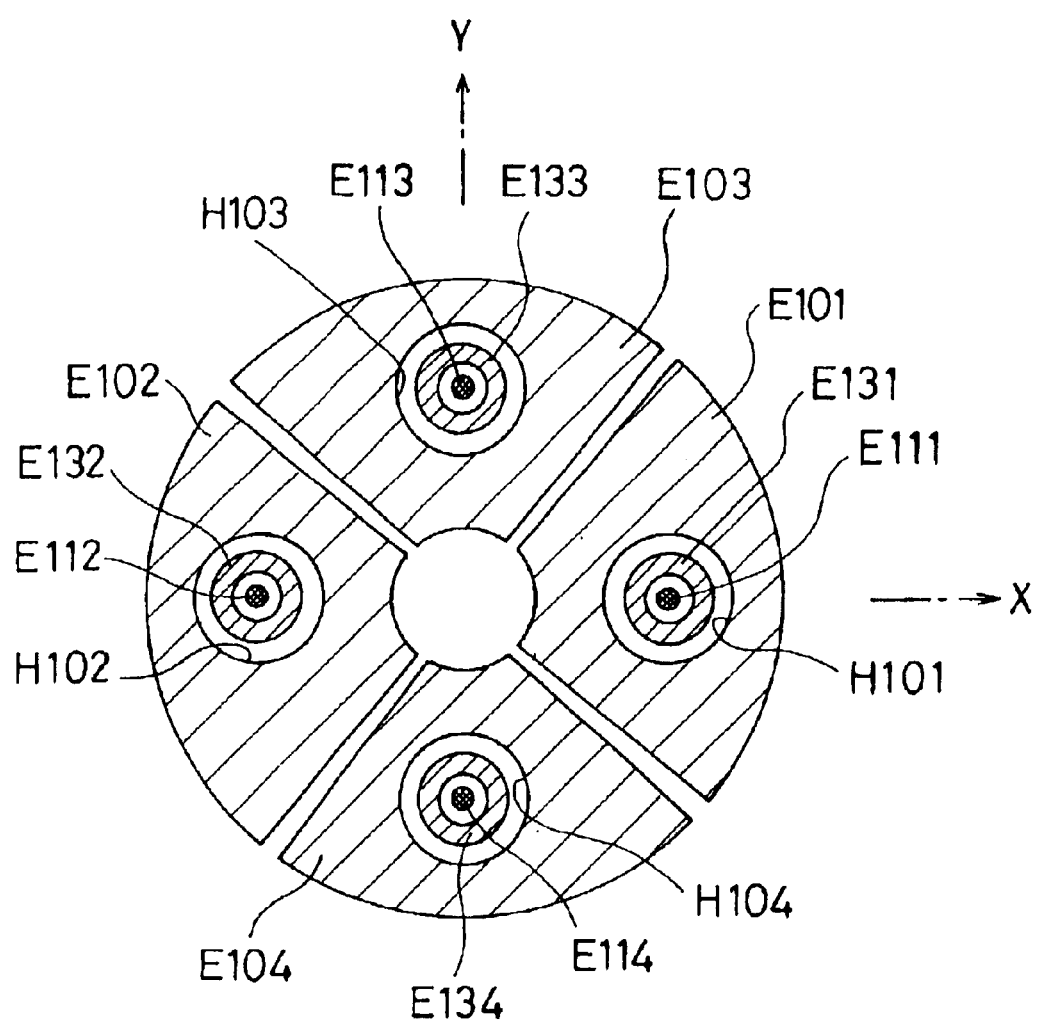
FIG. 15 is a view illustrating an arrangement of electrodes formed on a substrate of the capacitance type sensor of FIG. 13.
Figure 16:
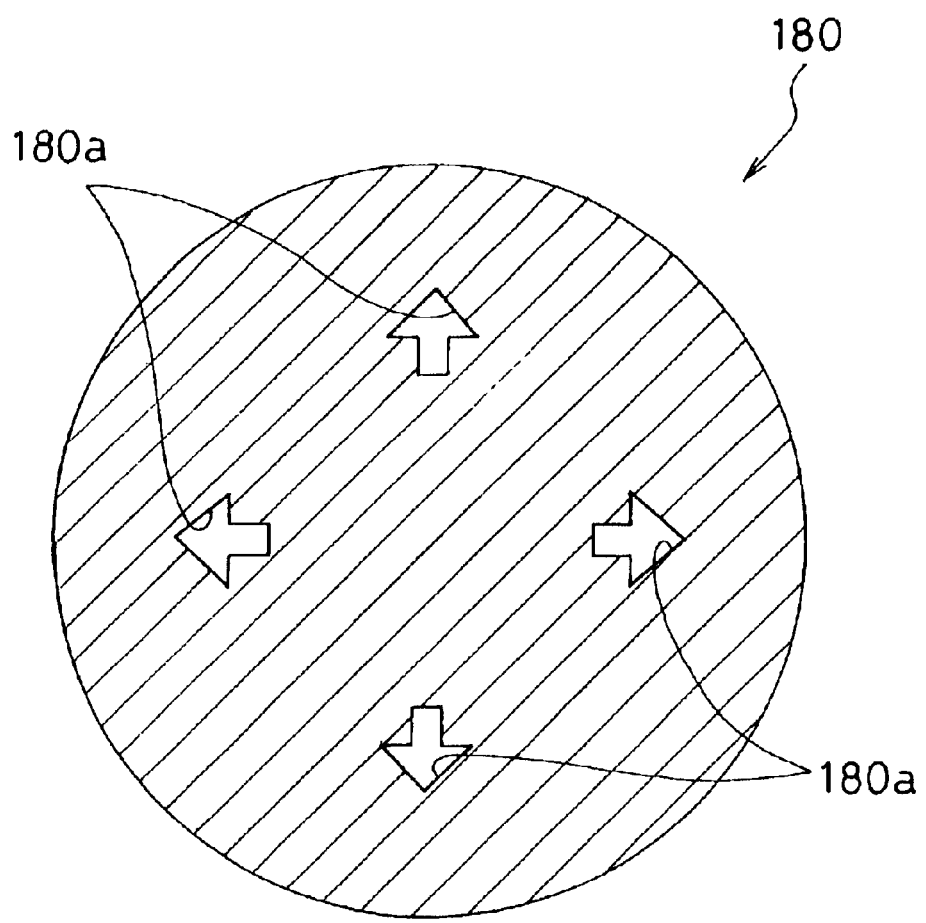
FIG. 16 is an upper view of a letter print member of the capacitance type sensor of FIG. 13.

FIG. 13 is a schematic sectional side view of a capacitance type sensor according to another embodiment of the present invention. FIG. 14 is an upper view of a detective member of the capacitance type sensor of FIG. 13. FIG. 15 is a view illustrating an arrangement of electrodes formed on, a substrate of the capacitance type sensor of FIG. 13. FIG. 16 is an upper view of a letter print member of the capacitance type sensor of FIG. 13.

The capacitance type sensor 110 includes a substrate 120, an operation detective member 130 to which a force is externally applied by being operated by a person or the like, a displacement electrode 140, capacitance element electrodes E101 to E104 formed on the substrate 120, movable switch electrodes E121 to E124 (FIG. 13 illustrates only E121 and E122) each having a dome shape, fixed switch electrodes E111 to E114 disposed inside the movable switch electrodes E121 to E124, reference electrodes (a common electrode) E131 to E134, a resin film 150 formed in close contact with some electrodes to partially cover the upper surface of the substrate 120, a supporting member 160 for supporting and fixing the displacement electrode 140 to the substrate 120, a letter print member 180 and a colored print member 190 disposed between the detective member 130 and the supporting member 160, a light-emitting diode 200 disposed within the supporting member 160, and a cover case 170 disposed so as to cover a peripheral portion of the supporting member 160.

For convenience of explanation, an XYZ three-dimensional coordinate system is defined as illustrated and the arrangement of the aforementioned components will be explained with reference to the coordinate system. That is, the origin O is set on the substrate 120 at the center position of the capacitance element electrodes E101 to E104 (in FIG. 13, the center position of the capacitance element electrodes E101 and E102), the X axis is set so as to horizontally extend rightward, the Z axis is set so as to vertically extend upward, and the Y axis is set so as to extend backward perpendicularly to FIG. 13. Thus, the upper surface of the substrate 120 is on the XY plane and the Z axis extends through the center position of the capacitance element electrodes E101 to E104 on the substrate 120 and the respective centers of the detective member 130, the letter print member 180, the colored print member 190, and the displacement electrode 140.

The substrate 120 may be a general printed circuit board for an electronic circuit, like the substrate 20. In this embodiment, a glass epoxy board is employed. Otherwise, a filmy substrate such as a polyimide film may be used as the substrate 120. However, such a filmy substrate may be too flexible, so it is preferably disposed on a sufficiently rigid supporting board.

The detective member 130 is made up of a small-diameter upper step portion 131 as a force-receiving portion and a large-diameter lower step portion 132 formed on the lower side of the upper step portion 131. The whole of the detective member 130 is made of polycarbonate, acryl, or the like, having transparency, into a disk shape. The diameter of the upper step portion 131 is substantially equal to the diameter of the circle determined by connecting the outer peripheral curves of the capacitance element electrodes E101 to E104, while the diameter of the lower step portion 132 is larger than the diameter of the circle determined by connecting the outer peripheral curves of the capacitance element electrodes E101 to E104. In order to improve the operability, a resin cap may be put on the detective member 130.

The supporting member 160 is made of a disk-shaped elastic transparent silicone rubber having a diameter larger than the diameter of the circle determined by connecting the outer peripheral curves of the capacitance element electrodes E101 to E104. As the material for making the supporting member 160, other than the silicone rubber, a styrene-butadiene rubber, a nitrile rubber, a thermoplastic resin such as a polyester-base resin or a polyimide-base resin, or the like, can be used.

On the lower side of the supporting member 160 formed are a circular recess 160a open downward and having a diameter larger than the diameter of the circle determined by connecting the outer peripheral curves of the capacitance element electrodes E101 to E104, and a recess 160c. The lower surface of the supporting member 160 other than the recesses 160a and 160c is disposed in contact with the substrate 120. On the lower side of the supporting member 160, within the recess 160a, a protrusion 160b concentric with the recess 160a is formed. The light-emitting diode 200 is disposed on the substrate 120 at a position corresponding to the recess 160c of the supporting member 160.

The displacement electrode 140 is made of a conductive transparent (having a transparency) silicone rubber. It is a disk-shaped filmy member having a diameter substantially equal to the diameter of the circle determined by connecting the outer peripheral curves of the capacitance element electrodes E101 to E104, and it is bonded to the protrusion 160b on the lower side of the supporting member 160. The displacement electrode 140 may be made of, other than the silicone rubber, urethane, a ethylene propylene rubber, or a film or filmy member in which metallic particles, fibers, or the like, such as iridium oxide or tin oxide, have been dispersed and mixed in a transparent resin. Since the displacement electrode 140 is formed to be planar (to be flush) on the lower surface of the supporting member 160, it also can be made by applying a transparent conductive ink by screen printing.

As illustrated in FIG. 15, on the substrate 120 formed are capacitance element electrodes E101 to E104 each having a fan shape whose center is at the origin and having circular holes H101 to H104 at their respective substantially central portions, ring-shaped reference electrodes E131 to E134 disposed within the respective holes H101 to H104 and each having an outer diameter smaller than the diameter of the holes H101 to H104, and fixed switch electrodes E111 to E114 disposed inside the respective reference electrodes E131 to E134. The capacitance element electrodes E101 and E102 in a pair are disposed at a distance from each other along the X axis and symmetrically in relation to the Y axis. Also, the capacitance element electrodes E103 and E104 in a pair are disposed at a distance from each other along the Y axis and symmetrically in relation to the X axis.

In this embodiment, the capacitance element electrode E101 is disposed so as to correspond to the positive direction of the X axis while the capacitance element electrode E102 is disposed so as to correspond to the negative direction of the X axis. Thus, they are used for detecting the X-axis directional component of an external force. Also, the capacitance element electrode E103 is disposed so as to correspond to the positive direction of the Y axis while the capacitance element electrode E104 is disposed so as to correspond to the negative direction of the Y axis. Thus, they are used for detecting the Y-axis directional component of an external force.

The capacitance element electrodes E101 to E104, the fixed switch electrodes E111 to E114, and the reference electrodes E131 to E134 are connected with terminals T101 to T104, T111 to T114, and T131 to T134 (see FIG. 16) via through-holes or the like, respectively. They are connected with an external electronic circuit through those terminals. In this embodiment, the reference terminals E131 to E134 are grounded through the terminals T131 to T134.

Dome-shaped movable switch electrodes E121 to E124 are disposed so as to be in contact with the respective reference electrodes E131 to E134 and distant from the respective fixed switch electrodes E111 to E114 over the fixed switch electrodes E111 to E114. Therefore, each of the switch electrodes E121 to E124 has its diameter larger than the diameter of the holes H101 to H104. Each of the movable switch electrodes E121 to E124 is made of a transparent resin film, and as its material, polyester, polycarbonate, or the like, is used.

The resin film 150 is an insulating transparent member, which is fixedly bonded with an adhesive so as to be in close contact with the capacitance element electrodes E101 to E104 on the substrate 120, parts of the reference electrodes E131 to E134, and the movable switch electrodes E121 to E124 and to cover the corresponding part of the upper surface of the substrate 20. Therefore, the portions of the capacitance element electrodes E10 to E104, the reference electrodes E131 to E134, and the movable switch electrodes E121 to E124, which are made of copper or the like, covered with the resin film 150, are never exposed to air. Thus, the resin film 150 has a function of preventing them from being oxidized. Since the resin film 150 is formed, the capacitance element electrodes E101 to E104, the reference electrodes E131 to E134, and the movable switch electrodes E121 to E124 never come into direct contact with the displacement electrode 140.

On the upper surface of the supporting member 160 disposed are a disk-shaped colored print member 190 having the same diameter as the detective member 130, a disk-shaped letter print member 180 having the same diameter as the detective member 130, and the detective member 130, concentrically with one another. Each of the supporting member 160, the colored print member 190, the letter print member 180, and the detective member 130 is fixed by welding, adhesion, or printing.

The letter print member 180 is a member not transparent, in which arrow-shaped through-holes 180a for indicating the respective operation directions (movement directions of a cursor) are formed so as to correspond to the positive and negative directions of the X and Y axes, i.e., to the fixed switch electrodes E11 to E114, as illustrated in FIG. 16. In this embodiment, the through-holes 180a are formed at positions corresponding to the respective movable switch electrodes E121 to E124, the respective fixed switch electrodes E111 to E114, and the respective reference electrodes E131 to E134. Note that the shapes of the through holes 180a formed in the letter print member 180 may be properly changed at need, e.g., into numerals, letters, symbols, or the like.

The letter print member 180 allows light to pass only through the portion of each through-hole 180a and prevents light from passing through the portion other than the through-holes 180a. Therefore, light emitted from the light-emitting diode 200 disposed within the supporting member 160 passes toward the upper portion of the detective member 130 through the supporting member 160, the colored print member 190, the through-holes 180a of the letter print member 180, and the detective member 130 in this order. Thus, when the detective member 130 is viewed from the upper side, the arrows (the portions of the through-holes 180a formed in the letter print member 180) indicating operation directions are seen with being illuminated by the light from the light-emitting diode 200. By this, the position and operation directions of the detective member 130 can easily be grasped. In particular, even when a device provided with the capacitance type sensor 110 is used in a dark place, an appropriate operation can be applied to the detective member 130.

The colored print member 190 is a transparent member the whole surface of which has been colored into a predetermined color. By disposing the colored print member 190 below the letter print member 180, when the detective member 130 is viewed from the upper side, the arrows indicating the operation directions can be seen in the color into which the colored print member 190 has been colored. Note that the colored print member 190 may be colored only at the portions corresponding to the through-holes 180a of the letter print member 180. Besides, it may be colored into a plurality of colors. Further, the colored print member 190 may be disposed above the letter print member 180, or it may not be provided.

Since the displacement electrode 140 and the resin film 150 transmit and diffuse the light emitted from the light-emitting diode 200, the light can be spread over the entire detective member 130 and so the portions of the through-holes 180a formed in the letter print member 180 can efficiently be illuminated. A reduction of power consumption of the light-emitting diode 200 can be achieved thereby.

Figure 17:
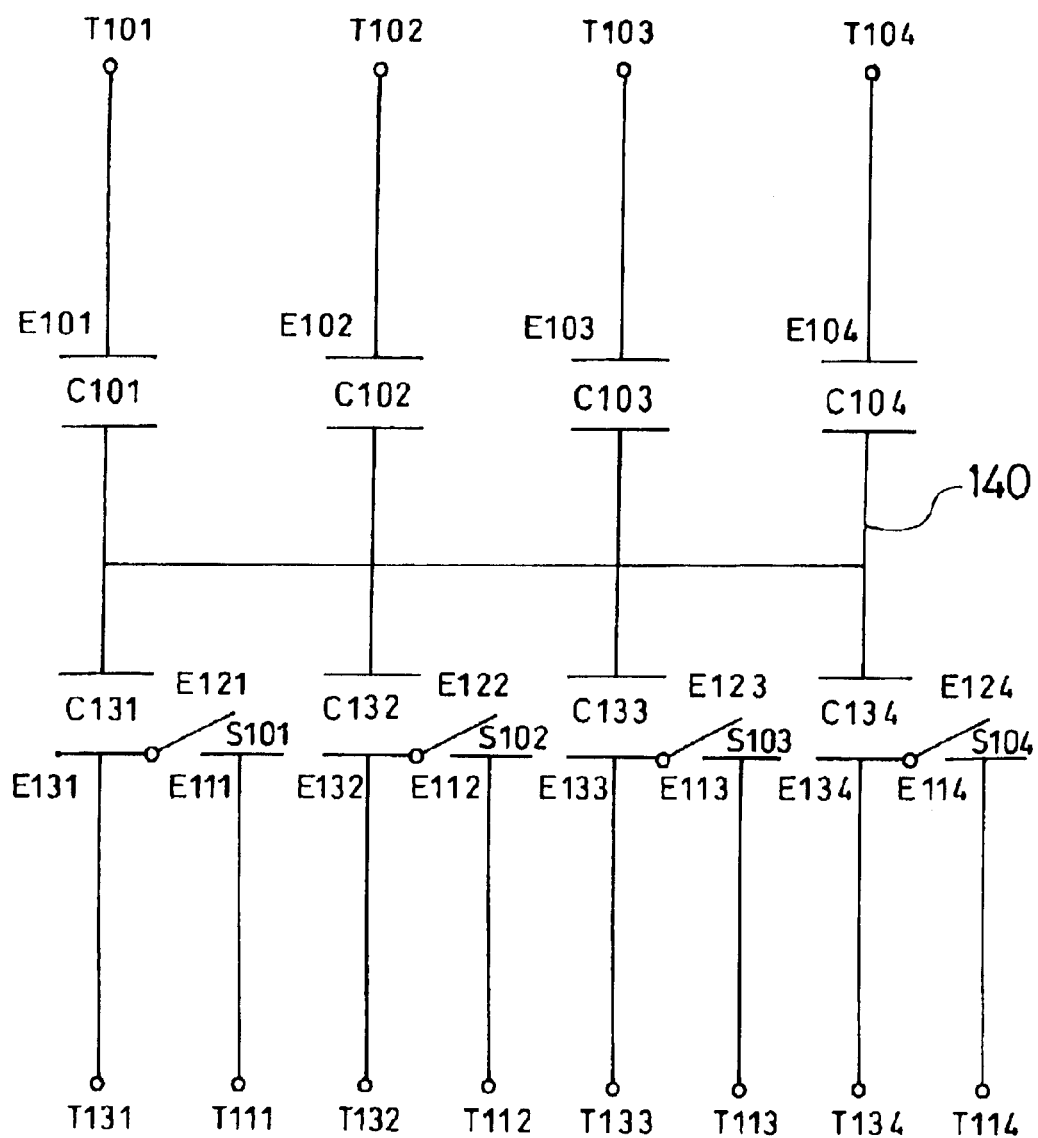
FIG. 17 is a circuit diagram equivalent to the construction of the capacitance type sensor illustrated in FIG. 13.

Next, the operation of the capacitance type sensor 110 according to this embodiment constructed as described above will be described with reference to a drawing. FIG. 17 is a circuit diagram equivalent to the construction of the capacitance type sensor illustrated in FIG. 13.

First, a circuit construction equivalent to the construction of the capacitance type sensor 110 will be described with reference to FIG. 17. The capacitance element electrodes E101 to E104 and the reference electrodes E131 to E134 formed on the substrate 120 are opposite to the displacement electrode 140. Capacitance elements C101 to C104 and C131 to C134 are formed between the deformable displacement electrode 140 as a common electrode and the respective fixed capacitance element electrodes E101 to E104 and reference electrodes E131 to E134. The capacitance elements C101 to C104 and C131 to C134 are variable capacitance elements whose capacitance values change due to the deformation of the displacement electrode 40.

The capacitance values of the capacitance elements C101 to C104 can be measured independently of one another as the capacitance values between the displacement electrodes 140 and the terminals T101 to T104 connected with the respective capacitance element electrodes E101 to E104. The reference electrodes E131 to E134 are grounded through the terminals T131 to T134, respectively. The displacement electrode 140 as the common electrode of the capacitance elements C101 to C104 is considered to be grounded through the capacitance elements C131 to C134 and the terminals T131 to T134. That is, the capacitance elements C131 to C134 make capacitive couplings between the displacement electrode 140 and the terminals T131 to T134.

The movable switch electrodes E121 to E124 connected with the reference electrodes E131 to E134 corresponding to the positive and negative directions of the X and Y axes can selectively take the positions in contact with the fixed switch electrodes E111 to E114 and positions not in contact with the fixed switch electrodes E111 to E114. Thus, the movable switch electrodes E121 to E124 have functions as switches S101 to S104 for connecting the reference electrodes E131 to E134 with the terminals T111 to T114 and disconnecting the former from the latter. Switch signals corresponding to the states of the switches S101 to S104 are output through the terminals T111 to T114, respectively.

Next, the operation of the capacitance type sensor 110 in case of being used as a device (force sensor) for detecting the intensity of a force applied to the detective member 130 will be described.

Figure 18:
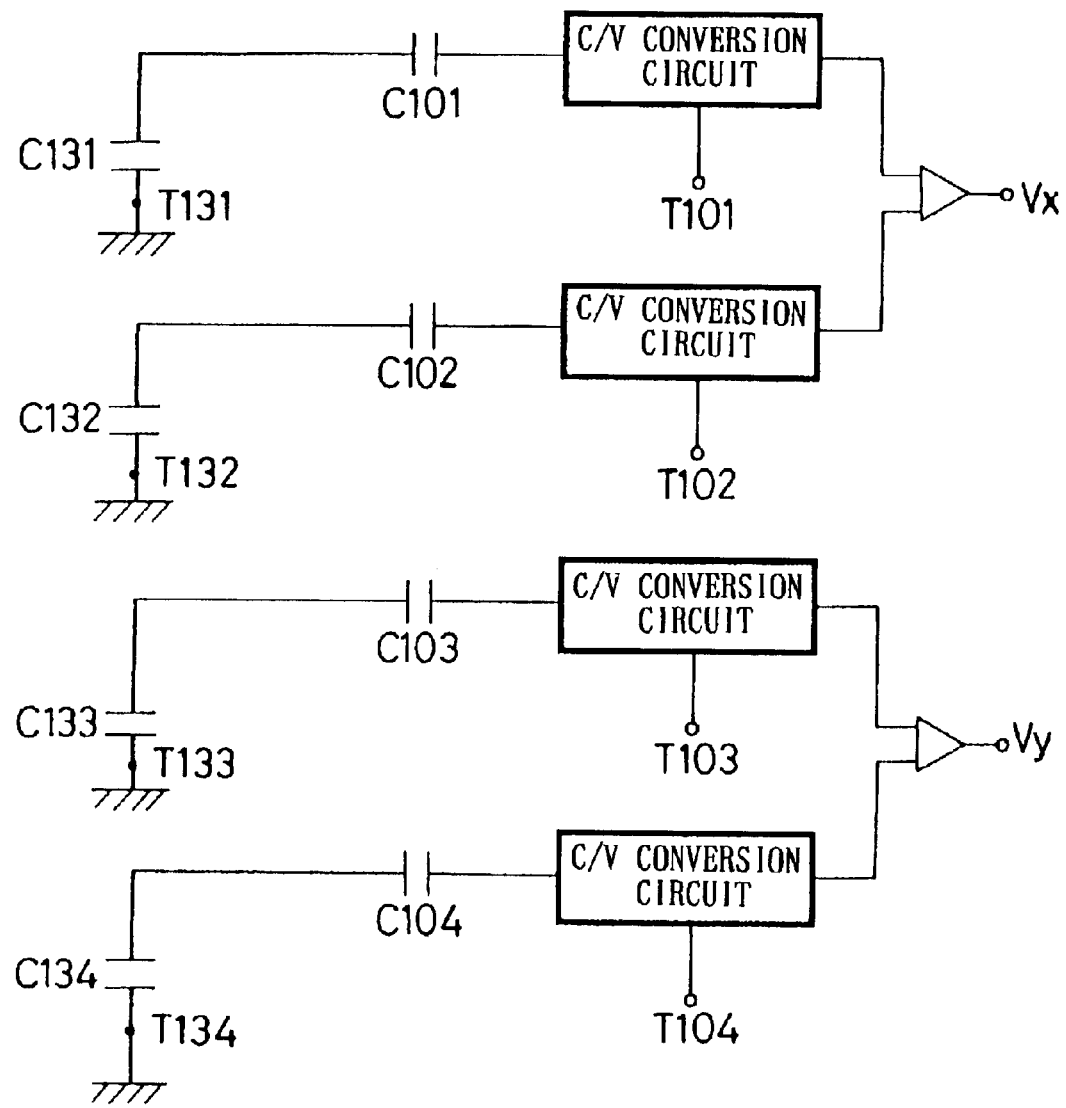
FIG. 18 is an explanatory diagram for explaining a method for deriving an output signal from a cyclic signal input to the capacitance type sensor illustrated in FIG. 13.

First, a deriving method of an output signal indicating the intensity and direction of an external force to the detective member 130, from a change in capacitance value of each of the capacitance elements C101 to C104 will be described with reference to a drawing. FIG. 18 is an explanatory diagram for explaining a method for deriving an output signal from a cyclic signal input to the capacitance type sensor illustrated in FIG. 13. Note that FIG. 18 illustrates only the necessary portion for explaining the method for deriving an output signal. Output signals $V_x$ and $V_y$ indicate the intensities and directions of the X-axis directional component and the Y-axis directional components of an external force, respectively.

For deriving the output signals $V_x$ and $V_y$ a cyclic signal such as a clock signal is always being input to each of the terminals T101 to T104. In relation to the cyclic signal being input to the terminal T101, two capacitance elements C101 and C131 are connected in series. Also, two capacitance elements C102 and C132 are connected in series in relation to the cyclic signal being input to the terminal T102, two capacitance elements C103 and C133 are connected in series in relation to the cyclic signal being input to the terminal T103, and two capacitance elements C104 and C134 are connected in series in relation to the cyclic signal being input to the terminal T104.

When the detective member 130 receives an external force and deforms in a state that the cyclic signals are being input to the terminals T101 to T104, the displacement electrode 140 accordingly deforms in a Z-axis direction. The distances of the electrodes of the capacitance elements C101 to C104 then change and the capacitance values of the respective capacitance elements C101 to C104 change. As a result, phase shifts in the cyclic signals being input to the terminals T101 to T104 occur. Using the phase shifts thus occurring in the cyclic signals, the output signals $V_x$ and $V_y$ can be obtained which indicate the deformation of the detective member 130, i.e., the intensities and directions in the X-axis direction and the Y-axis direction of the external force received by the detective member 130. The detailed description of the deriving method will be omitted because it is the same as the description made in relation to the signal processing circuit in the capacitance type sensor of FIG. 1.

Next, the operation of the capacitance type sensor 110 when being used as a device having a switch function (a switch signal output device) will be described. Here will be described only the operation when a portion of the detective member 130 corresponding to the X-axis positive direction is depressed. Since the operation when a portion of the detective member 130 corresponding to the X-axis negative direction, Y-axis positive direction, or Y-axis negative direction is depressed, is similar to the operation when the portion corresponding to the X-axis positive direction is depressed, the description thereof will be omitted.

While no operation is applied to the detective member 130, the movable switch electrode E121 and the fixed switch electrode E111 are distant from each other. Thus, the switch S101 is in its OFF state and a switch signal indicating the OFF state is being output through the terminal T111. When a portion of the detective member 130 corresponding to the X-axis positive direction is depressed, an X-axis positive portion of the displacement electrode 140 is displaced downward. A downward force is then applied from the displacement electrode 140 through the resin film 150 to a central portion of the movable switch electrode E121.

If the force is less than a predetermined value, the movable switch electrode E121 little deforms. But, once the force reaches the predetermined value, a portion of the movable switch electrode E121 in the vicinity of its top is rapidly elastically deformed with buckling to be in a concave state and come into contact with the fixed switch electrode E111. The switch S1 is thereby turned ON. At this time, the switch signal being output through the terminal T111 is changed from the signal indicating the OFF state to a signal indicating the ON state. The operator is given a distinct click feeling.

In this way, by the operator depressing portions of the detective member 130 corresponding to the X-axis positive direction, X-axis negative direction, Y-axis positive direction, and Y-axis negative direction, four independent switch signals corresponding to the respective directions can be output.

Figure 19:
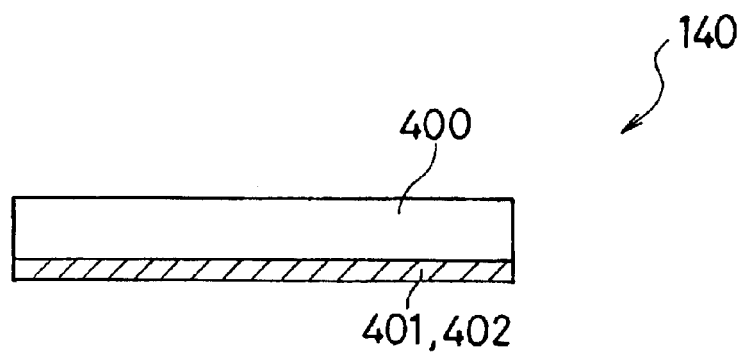
FIG. 19 are views illustrating displacement electrodes each made up of a supporting member and a deposit film or a printed layer.
Figure 19:
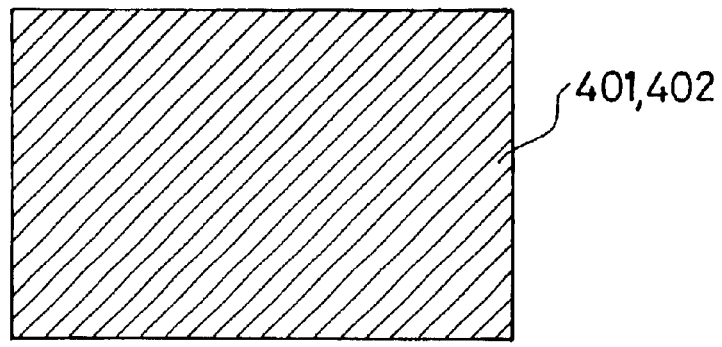
Figure 19:
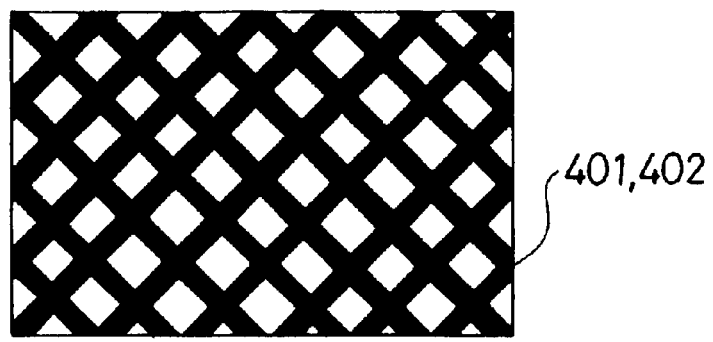
Figure 19:
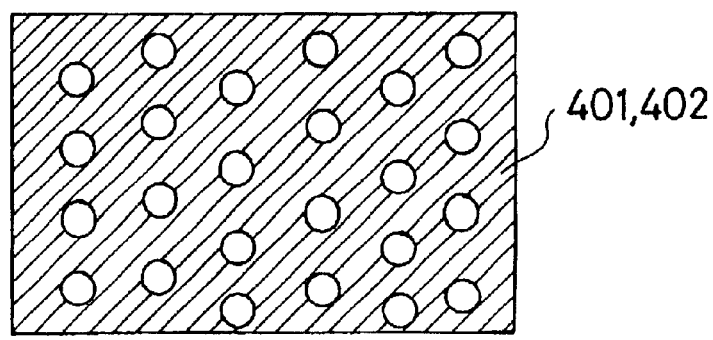
Figure 20:
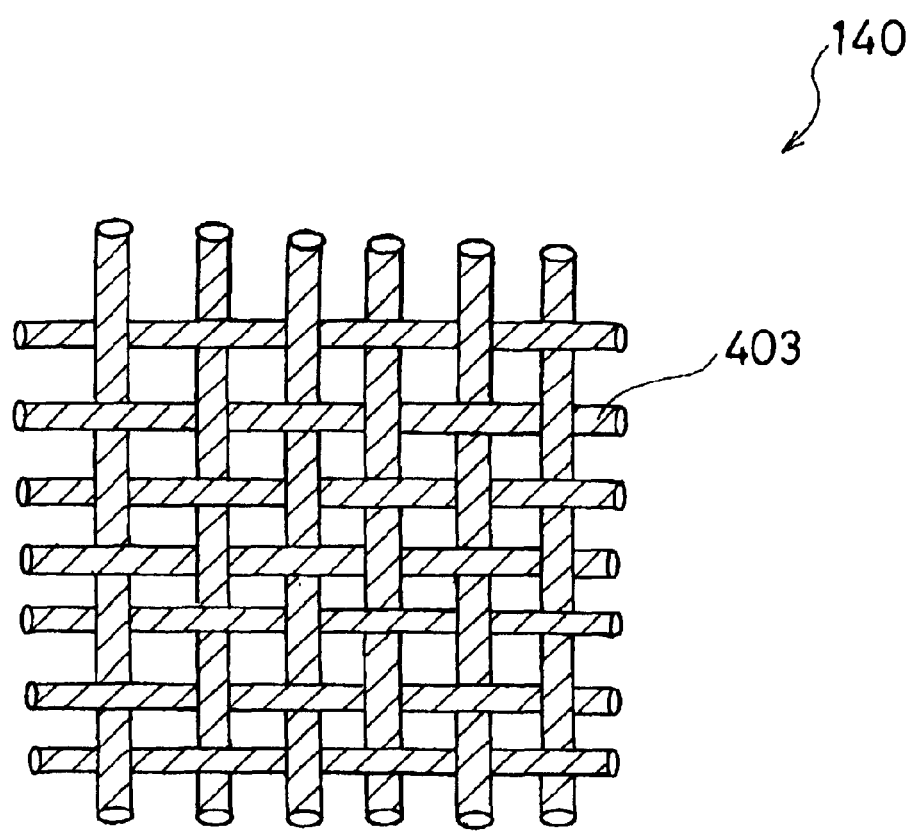
FIG. 20 is a view illustrating a displacement electrode made of a woven fabric.
Figure 21:
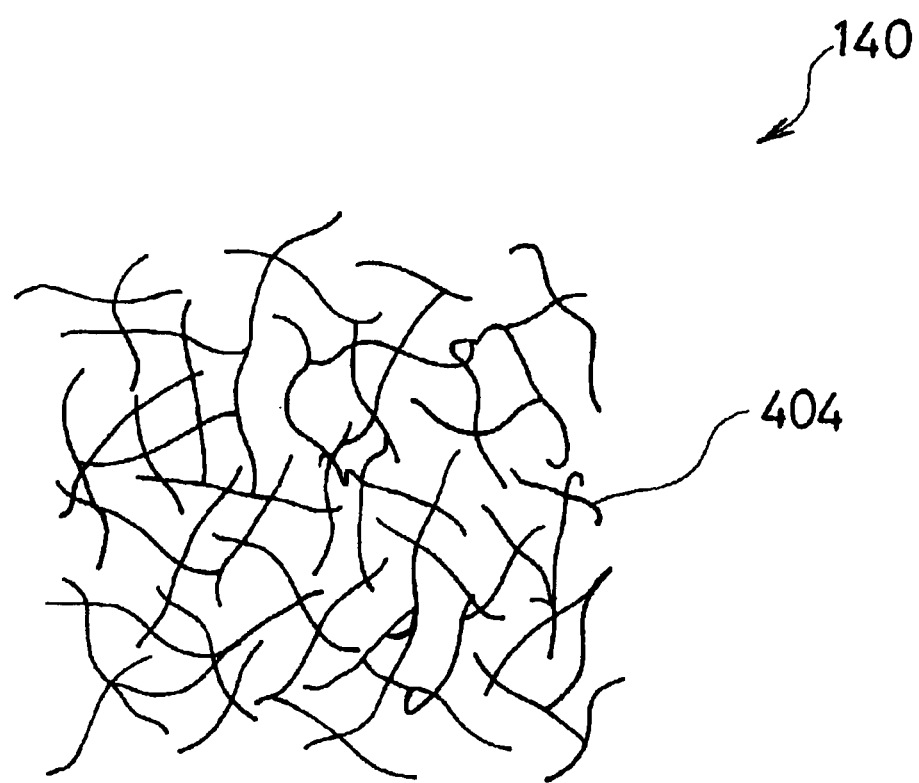
FIG. 21 is a view illustrating a displacement electrode made of a non-woven fabric.
Figure 22:
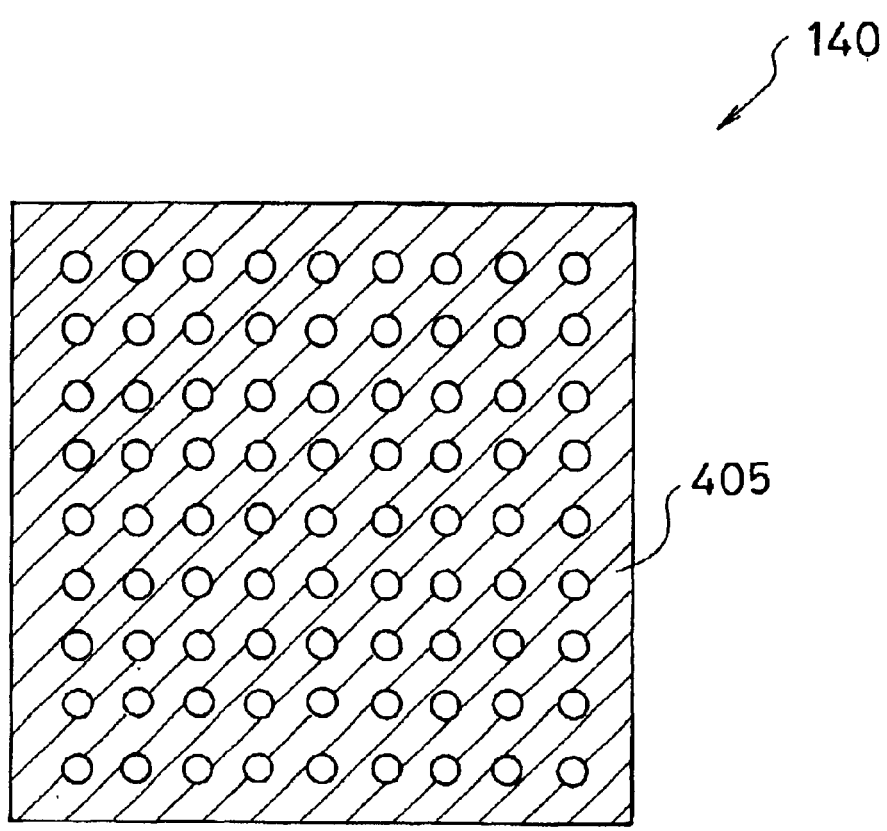
FIG. 22 is a view illustrating a displacement electrode made of a film.
Figure 23:
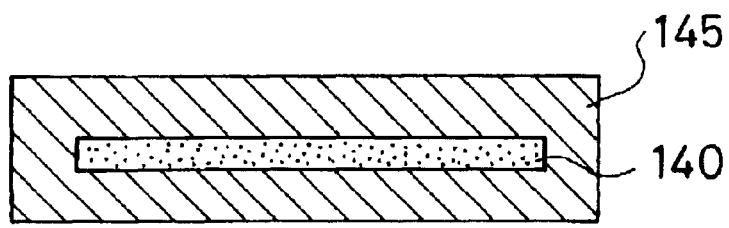
FIG. 23 are views illustrating constructions in each of which a displacement electrode has been complicated with an elastic body.
Figure 23:
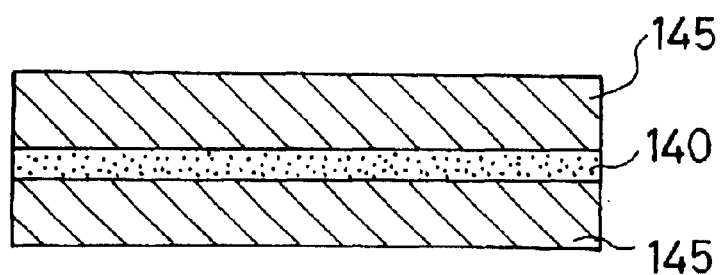
Figure 23:
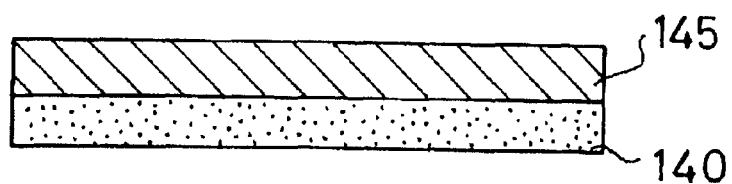

Next, other constructions of the displacement electrode 140 usable in this embodiment will be described with reference to drawings. FIG. 19 are views illustrating displacement electrodes each made up of a supporting member and a deposit film or a printed layer. FIG. 20 is a view illustrating a displacement electrode made of a woven fabric. FIG. 21 is a view illustrating a displacement electrode made of a non-woven fabric. FIG. 22 is a view illustrating a displacement electrode made of a film. FIG. 23 are views illustrating constructions in each of which a displacement electrode has been complicated with an elastic body.

As illustrated in FIGS. 19(a) and (b), as the displacement electrode 140 usable is a construction in which a deposit film 401 such as an ITO film (tin-containing indium oxide), a thin metallic film, or the like, with transparency and conductivity, is formed on the whole of a surface of a supporting member 400 made of a resin (plastic) such as polyethylene terephthalate (PET) with transparency. Such a deposit film 401 may be formed into a mesh pattern as illustrated in FIG. 19(c) or into a porous pattern as illustrated in FIG. 19(d). The mesh size in case of the mesh pattern, or the size, shape, and arrangement of the holes (the portions where the deposit film 401 is not formed) in case of the porous pattern may be properly varied.

Also, as illustrated in FIGS. 19(a) and (b), as the displacement electrode 140 usable is a construction in which a print layer 402 is formed by applying a conductive ink, a conductive paint, or the like, on the whole of a surface of the transparent supporting member 400. Such a print layer 402 may be formed into a mesh pattern as illustrated in FIG. 19(c) or into a porous pattern as illustrated in FIG. 19(d). The mesh size in case of the mesh pattern, or the size, shape, and arrangement of the holes (the portions where the print layer 402 is not formed) in case of the porous pattern may be properly varied. A conductive ink or paint with no transparency may be used. Besides, in place of the displacement electrode 140 being bonded to the lower surface of the supporting member 160, the print layer 402 can be formed directly on the lower surface of the supporting member 160.

As illustrated in FIG. 20, a woven fabric 403 made of conductive fibers may be used as the displacement electrode 140. As the conductive fibers for making the woven fabric 403, metallic fibers such as stainless steel or copper, carbon fibers, conductive filmed fibers woven into nonconductive fibers, or the like, can be used.

Also, as illustrated in FIG. 21, a non-woven fabric (not fibrous) 404 made of conductive fibers may be used as the displacement electrode 140. As the conductive fibers for making the non-woven fabric 404, metallic fibers such as stainless steel or copper, carbon fibers, conductive filmed fibers woven into non-conductive fibers, or the like, can be used.

In such a woven or non-woven fabric 403 or 404, since conductive fibers are in contact with one another, a surface conductivity can be kept even when it is formed at a low fiber density. Besides, a construction in which conductive fibers are mixed in a non-conductive elastic body can be also used as the displacement electrode 140. In this case, however, many conductive fibers must be mixed at a high density and thus it must be minded to ensure sufficient transparency.

Further, as illustrated in FIG. 22, a film (sheet) 405 made of a nontransparent material having holes can be used as the displacement electrode 140. As the material for making the film 405, metal, a conductive plastic, a conductive rubber, or a conductive thermoplastic elastomer, or the like, can be used. The size and shape of each hole may be properly varied. The arrangement of the holes may be regular or irregular. If the ratio (occupancy) of the area of the holes to the whole area of the film 405 is increased, the transparency of the film 405 is improved (the transmissivity of light is increased), so the light emitted from the light-emitting diode 200 disposed within the supporting member 160 is more, easily introduced to the detective member 130. However, since the area opposite to the capacitance element electrodes E101 to E105 is decreased, the capacitance value of each of the capacitance elements C101 to C105 may be reduced. Thus, when the sizes and arrangement of the holes are determined, the above fact must be taken into consideration.

Although the displacement electrode 140 as described above (the supporting member 400 on which the deposit film 401 or the print layer 402 is formed, the woven fabric 403, the non-woven fabric 404, or the film (sheet) 405) can be used solely, it can be also used with being complicated with a transparent elastic body 145. Such a complication of the displacement electrode 140 with the transparent elastic body 145 brings about an effect that handling and mounting the displacement electrode 140 become easy As the complicated construction of them usable is a construction in which the displacement electrode 140 is involved in an elastic body 145 as illustrated in FIG. 23(a), a construction in which the displacement electrode 140 is sandwiched by two elastic bodies 145 as illustrated in FIG. 23(b), or a construction in which the displacement electrode 140 is bonded to an elastic body 145 as illustrated in FIG. 23(c).

As the material for making the elastic body 145, usable is a transparent compound rubber such as silicone rubber, EPD (ethylene-propylene rubber), NR (natural rubber), BR (butadiene rubber), SBR (styrene-butadiene rubber), NBR (nitrile rubber), IIR (butyl rubber), CR (chloroprene rubber), CSM (chlorosulfonic polyethylene), ACM (acryl rubber), or ANM (acryl rubber); a transparent thermoplastic elastomer such as styrene-base, olefin-base, urethane-base, polyester-base, polyamide-base, polydiene-base, or fluorine-base; or the like.

As a method for complicating the displacement electrode 140 with the elastic body 145, usable is a method in which the displacement electrode 140 is coated with the liquid material of the elastic body 145 and then they are cross-linked (by applying heat); a method in which the displacement electrode 140 is dipped in the liquid material of the elastic body 145 for coating, they are dried to remove the solvent and so on, and then they are cross-linked; a method in which the displacement electrode 140 is laminated on the sheet-like elastic body 145 and then they are cross-linked to be bonded; a method in which the displacement electrode 140 is put in a mold, the elastic body 145 is then put on the displacement electrode 140, and then they are cross-linked to be bonded; or the like. In the aforementioned method using a mold, processing the displacement electrode 140 into a three-dimensional shape, e.g., forming a protrusion on a surface of the displacement electrode 140, can easily be performed.

As described above, in the capacitance type sensor 110 of this embodiment, since the displacement of the detective member 130 can be recognized by detecting changes in capacitance value of the capacitance elements C101 to C104 caused by changes in distances between the displacement electrode 140 and the capacitance element electrodes E101 to E104, the intensity of a force externally applied to the detective member 130 can be recognized. Besides, since it can be recognized whether or not the fixed switch electrodes E111 to E114 are in contact with the movable switch electrodes E121 to E124, this can be used as a switch. Thus, the capacitance type sensor 110 can be used as a device having a function of outputting the displacement of the detective member 130 as a signal (an analogue signal) or/and a device having a switch function. By this, the capacitance type sensor 110 has a function as a complex device that can be used as either of the aforementioned devices, and there is no necessity of remaking it to meet both applications.

In case of being used as a device having a switch function, when an operation is applied to the detective member 130, the dome-shaped movable switch electrodes E121 to E124 corresponding to the operation direction are elastically deformed with a click feeling to come into contact with the fixed switch electrodes E111 to E114. Therefore, the operator can execute the operation with having the click feeling and so he or she can easily sensually grasp the execution of the operation. Besides, since the movable switch electrodes E121 to E124 are arranged so that they can be brought into contact with the reference electrodes E131 to 134, separate wirings for the movable switch electrodes E121 to E124 need not be provided.

Also, a plurality of capacitance electrodes E101 to E104 are formed, and components in the X-axis directions and Y-axis directions of an external force received by the detective member 130 can be recognized independently of one another. Since signals different in phase from each other are supplied to capacitance element electrodes in a pair (E101 and E102, and E103 and E104), phase shift by passing through a circuit can be made large. Further, since a signal processing circuit utilizing a logic element is used, the signal can accurately be detected. Besides, a plurality of movable switch electrodes E121 to E124 and a plurality of fixed switch electrodes E111 to E114 are formed to correspond to the X-axis directions and Y-axis directions, they can use as switches corresponding to different directions. The capacitance type sensor of this construction is suitably used as an input device for a personal computer, a portable telephone, games, or the like.

Since the displacement electrode 140 is, without being in direct contact, electrically coupled with the reference electrodes E131 to E134 that are grounded through capacitive couplings by the capacitance elements C131 to C134 (each having a function of a coupling capacitor), the withstand voltage characteristic of the capacitance type sensor 110 is improved and the sensor is hardly broken due to the flow of a spark current. In addition, a bad condition in connection or the like can be prevented. Therefore, a highly reliable capacitance type sensor can be obtained. Besides, although the resin film 150 is disposed between the reference electrodes E131 to E134 and the displacement electrode 140, since there is no necessity of partially cutting the resin film 150 for bringing the reference electrodes E131 to E134 into contact with the displacement electrode 140, this is advantageous also in assembling and mounting.

Besides, since the light emitted from the light-emitting diode 200 passes through only the through-holes 180a formed in the letter print member 180, and then reaches the detective member 130, when the detective member 130 is viewed from the outside, only the through-holes 180a can be illuminated. Thus, the position and operation directions of the detective member 130 can easily be grasped. In particular, even when a device provided with the capacitive type sensor 110 is used in a dark place, an appropriate operation can be applied to the detective member. Further, when the detective member 130 is viewed from the outside, the color of the light illuminating the through-holes 180a can be varied.

Next, the third embodiment of the present invention will be described with reference to drawings.

Figure 24:
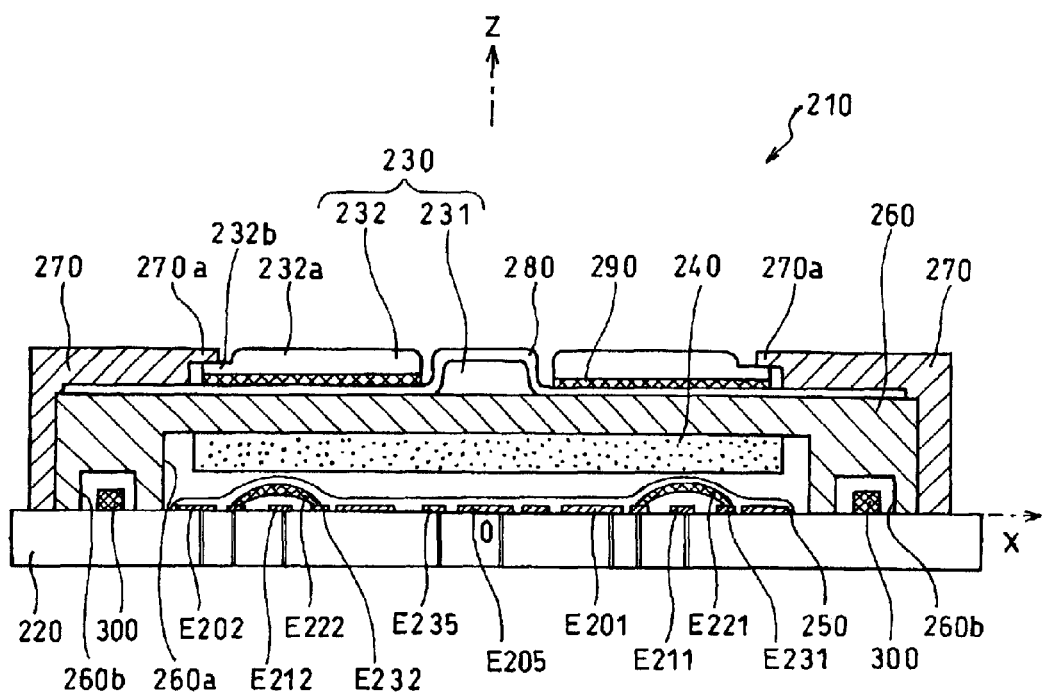
FIG. 24 is a schematic sectional view of a capacitance type sensor according to the third embodiment of the present invention.
Figure 25:
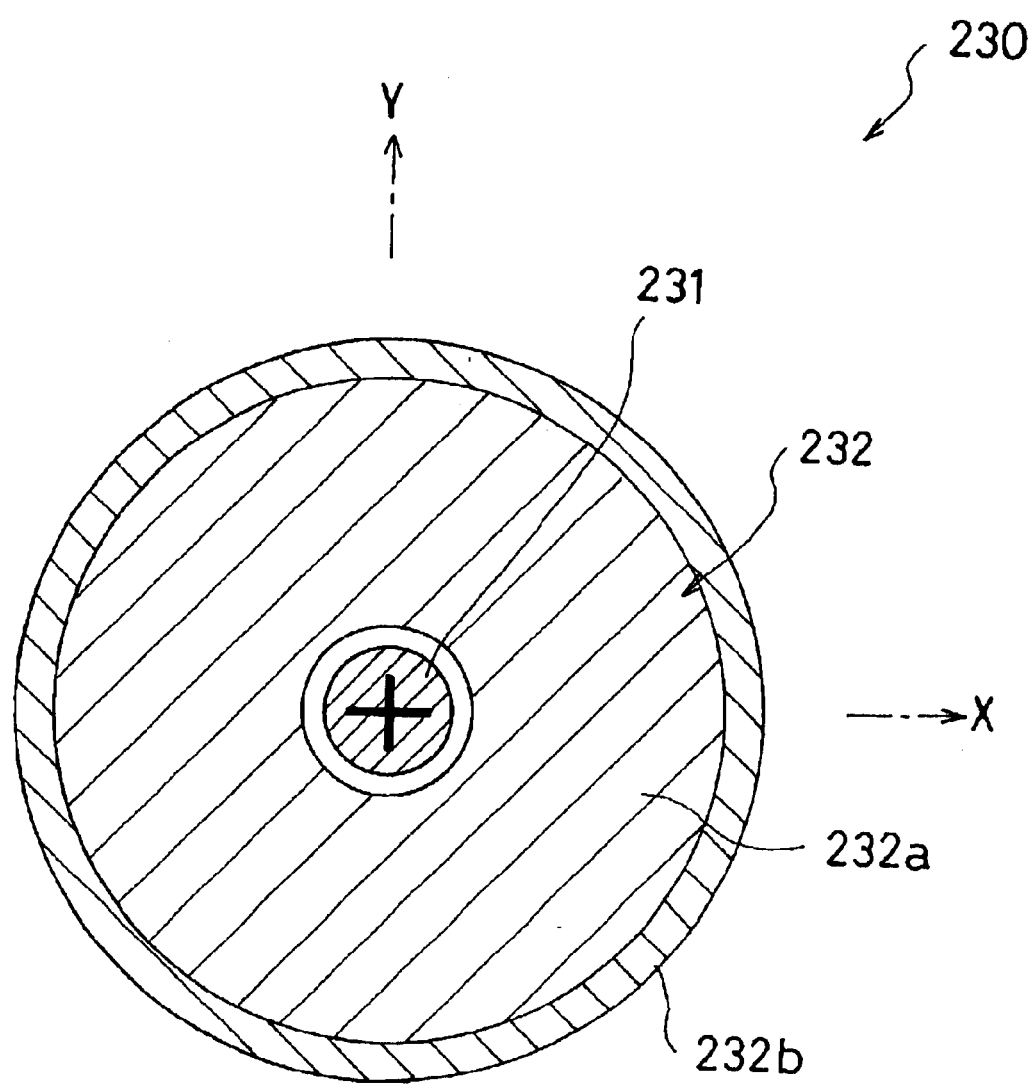
FIG. 25 is an upper view of a detective member of the capacitance type sensor of FIG. 24.
Figure 26:
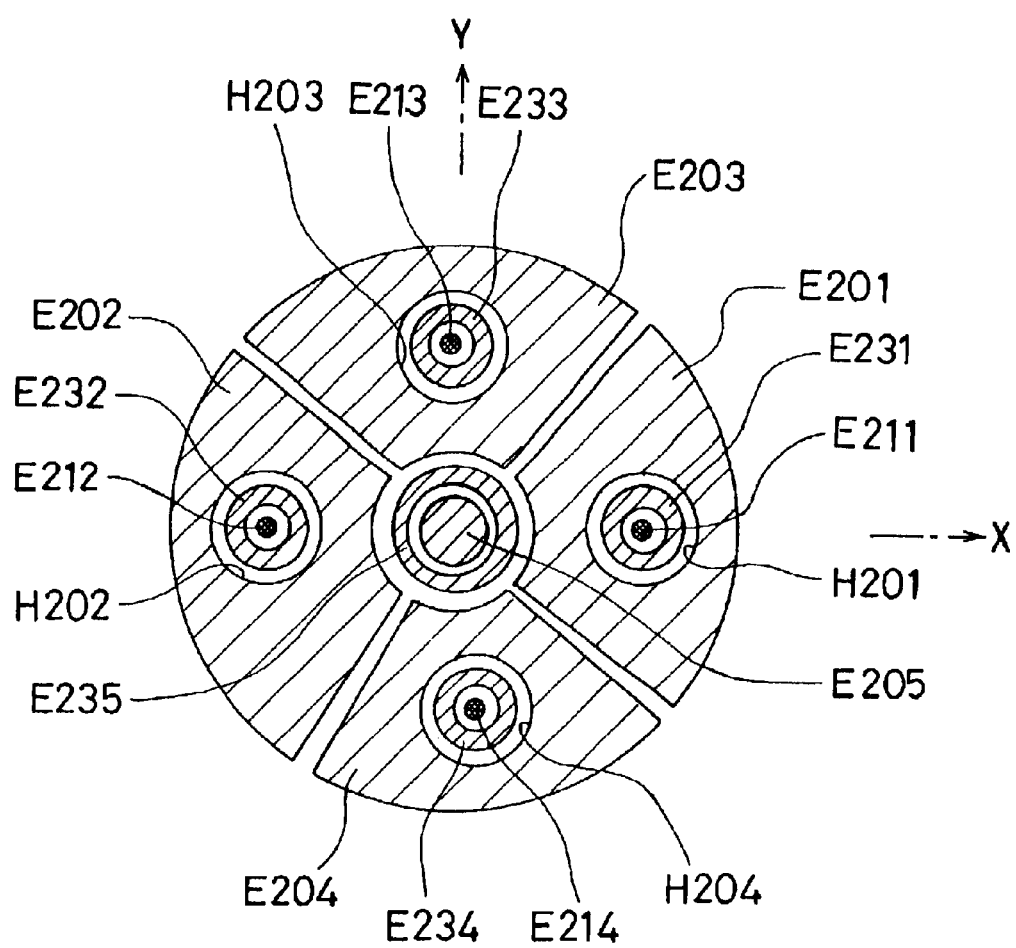
FIG. 26 is a view illustrating an arrangement of electrodes formed on a substrate of the capacitance type sensor of FIG. 24.
Figure 27:
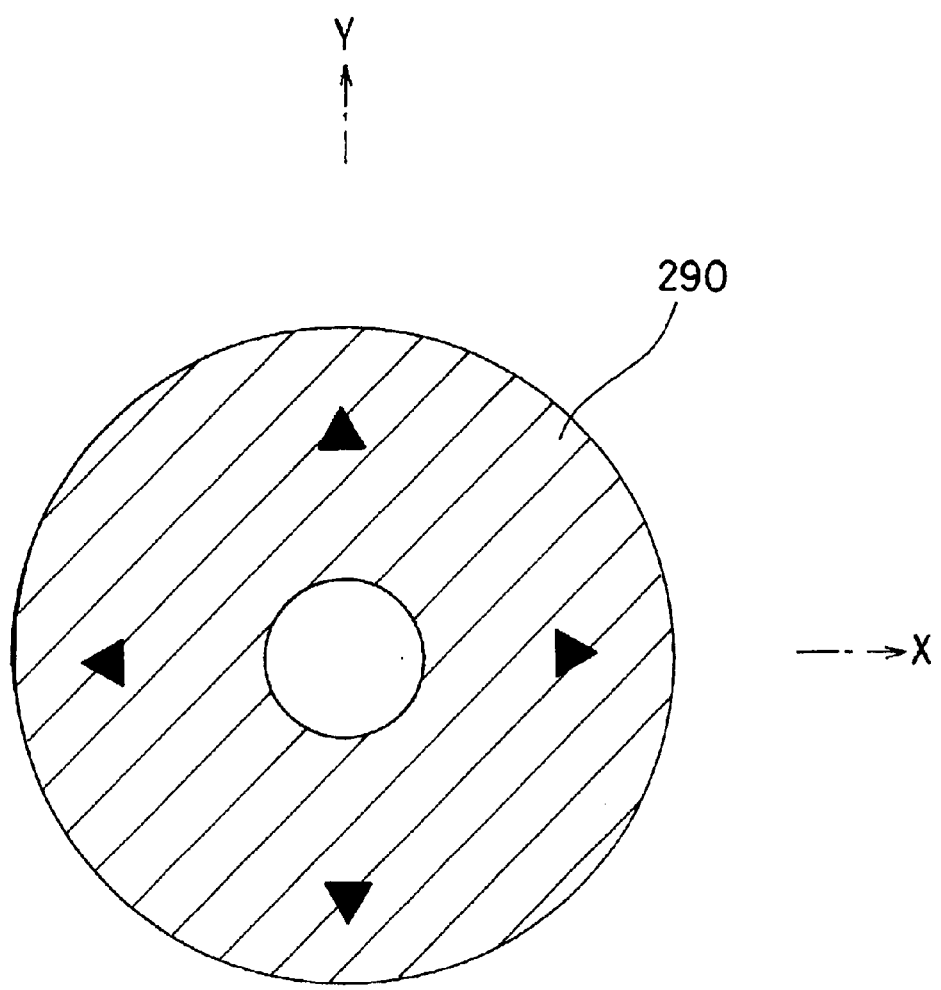
FIG. 27 is an upper view of a letter print member of the capacitance type sensor of FIG. 24.

FIG. 24 is a schematic sectional view of a capacitance type sensor according to the third embodiment of the present invention. FIG. 25 is an upper view of a detective member of the capacitance type sensor of FIG. 24. FIG. 26 is a view illustrating an arrangement of electrodes formed on a substrate of the capacitance type sensor of FIG. 24. FIG. 27 is an upper view of a letter print member of the capacitance type sensor of FIG. 24.

The capacitance type sensor 210 includes a substrate 220, a detective member 230 made up of a central button 231 and a side button 232 to each of which a force is externally applied by being operated by a person or the like, a displacement electrode 240, capacitance element electrodes E201 to E205 formed on the substrate 220, movable switch electrodes E221 to E224 (FIG. 24 illustrates only E221 and E222) each having a dome shape, fixed switch electrodes E211 to E214 (FIG. 24 illustrates only E211 and E212) disposed inside the movable switch electrodes E221 to E224, reference electrodes (a common electrode) E231 to E235, a resin film 250 formed in close contact with some electrodes to partially cover the upper surface of the substrate 220, a supporting member 260 for supporting and fixing the detective member 230 and the displacement electrode 240 to the substrate 220, a letter print film 280 disposed so as to cover the supporting member 260 and the central button 231, a letter print member 290 disposed between the side button 232 and the letter print film 280, two light-emitting diodes 300 disposed within the supporting member 260, and a cover case 270 disposed so as to cover peripheral portions of the supporting member 260 and the detective member 230.

For convenience of explanation, an XYZ three-dimensional coordinate system is defined as illustrated and the arrangement of the aforementioned components will be explained with reference to the coordinate system. That is, in FIG. 24, the origin O is set on the substrate 220 at the center of the capacitance element electrode E205, the X axis is set so as to horizontally extend rightward, the Z axis is set so as to vertically extend upward, and the Y axis is set so as to extend backward perpendicularly to FIG. 24. Thus, the upper surface of the substrate 220 is on the XY plane and the Z axis extends through the respective centers of the capacitance element electrode E205 on the substrate 220, the detective member 230, and the displacement electrode 240.

The substrate 220 may be a general printed circuit board for an electronic circuit, like the substrate 20. In this embodiment, a glass epoxy board is employed. Otherwise, a filmy substrate such as a polyimide film may be used as the substrate 220. However, such a filmy substrate may be too flexible, so it is preferably disposed on a sufficiently rigid supporting board.

The detective member 230 is made up of a circular central button 231 whose center is at the origin, and a ring-shaped side button 232 disposed outside the central button 231. Either of the central and side buttons 231 and 232 is made of a transparent member. In this way, since the central and side buttons 231 and 232 are made into separate members, operations to the respective members (an operation in a Z-axis direction and operations in X- and Y-axis directions) scarcely interferes with each other. The diameter of the central button 231 is substantially equal to the outer diameter of the reference electrode E235. The side button 32 is made up of a small-diameter upper step portion 232a as a force-receiving portion and a large-diameter lower step portion 232b formed on the lower side of the upper step portion 232a. The diameter of the upper step portion 232a is smaller than the diameter of the circle determined by connecting the outer peripheral curves of the capacitance element electrodes E201 to E204, while the diameter of the lower step portion 232b is substantially equal to the diameter of the circle determined by connecting the outer peripheral curves of the capacitance element electrodes E201 to E204.

The central button 231 is formed integrally with the letter print film 280 and bonded to the upper surface of the supporting member 260 so as to be opposite to the capacitance element electrode E205 and the reference electrode E235. As illustrated in FIG. 25, a symbol "+" is printed on the upper surface of the central button 231. The shape printed on the upper surface of the central button 231 may be properly changed into, e.g., a numeral, a letter, and a symbol, for indicating its function. The side button 232 is stopped by its lower step portion 232b abutting against a stopper portion 270a as a part of the cover case 270. The side button 232 is thereby disposed on the upper surface of the supporting member 260 with being prevented from coming off. The side button 232 may be bonded to the upper surface of the supporting member 260.

The supporting member 260 is made of a disk-shaped elastic transparent silicone rubber having a diameter larger than the diameter of the circle determined by connecting the outer peripheral curves of the capacitance element electrodes E201 to E204. As the material for making the supporting member 260, other than the silicone rubber, a styrene-butadiene rubber, a nitrile rubber, a thermoplastic resin such as a polyester-base resin or a polyimide-base resin, or the like, can be used.

On the lower side of the supporting member 260 formed are a circular recess 260a open downward and having a diameter larger than the diameter of the circle determined by connecting the outer peripheral curves of the capacitance element electrodes E201 to E204, and two recesses 260b. The lower surface of the supporting member 260 other than the recesses 260a and 260b is disposed in contact with the substrate 220. The light-emitting diodes 300 is disposed on the substrate 220 at positions corresponding to the two recesses 260b of the supporting member 160, respectively.

The displacement electrode 240 is made of a conductive transparent silicone rubber. It is a disk-shaped member having a diameter substantially equal to the diameter of the circle determined by connecting the outer peripheral curves of the capacitance element electrodes E201 to E204, and it is bonded to the lower surface of the supporting member 160 within the recess 260a.

As illustrated in FIG. 26, on the substrate 220 formed are a circular capacitance element electrode E205 whose center is at the origin O, a ring-shaped reference electrode E235 disposed outside the capacitance element electrode E205, fan-shaped capacitance element electrodes E201 to E204 disposed outside the reference electrode E235 and having circular holes H201 to H204 at their respective substantially central portions, ring-shaped reference electrodes E231 to E234 disposed within the respective holes H201 to H204 and each having an outer diameter smaller than the diameter of the holes H201 to H204, and fixed switch electrodes E211 to E214 disposed inside the respective reference electrodes E231 to E234.

The capacitance element electrodes E201 and E202 in a pair are disposed at a distance from each other along the X axis and symmetrically in relation to the Y axis. Also, the capacitance element electrodes E203 and E204 in a pair are disposed at a distance from each other along the Y axis and symmetrically in relation to the X axis. In this embodiment, the capacitance element electrode E201 is disposed so as to correspond to the positive direction of the X axis while the capacitance element electrode E202 is disposed so as to correspond to the negative direction of the X axis. Thus, they are used for detecting the X-axis directional component of an external force. Also, the capacitance element electrode E203 is disposed so as to correspond to the positive direction of the Y axis while the capacitance element electrode E204 is disposed so as to correspond to the negative direction of the Y axis. Thus, they are used for detecting the Y-axis directional component of an external force. That is, each of the capacitance electrodes E201 to E204 is used for detecting a force pressing the electrode. The capacitance element electrode E205 is disposed over the origin as described above, and it is used for detecting the Z-axis directional component of an external force.

The capacitance element electrodes E201 to E205, the fixed switch electrodes E211 to E214, and the reference electrodes E231 to E235 are connected with terminals T201 to T205, T211 to T214, and T231 to T235 (see FIG. 28) via through-holes or the like, respectively. They are connected with an external electronic circuit through those terminals. In this embodiment, the reference terminals E231 to E235 are grounded through the terminals T231 to T235.

Dome-shaped movable switch electrodes E221 to E224 are disposed so as to be in contact with the respective reference electrodes E231 to 234 and distant from the respective fixed switch electrodes E211 to E214 over the fixed switch electrodes E211 to E214. Therefore, each of the switch electrodes E221 to E224 has its diameter larger than the inner diameter of the corresponding one of the reference electrodes E231 to E234.

The resin film 250 is an insulating member, which is fixedly bonded with an adhesive so as to be in close contact with the capacitance element electrodes E201 to E205 on the substrate 220, parts of the reference electrodes E231 to E234, the reference electrode E235, and the movable switch electrodes E221 to E224 and to cover the corresponding part of the upper surface of the substrate 220. Therefore, the portions of the capacitance element electrodes E201 to E205, the reference electrodes E231 to E235, and the movable switch electrodes E221 to E224, which are made of copper or the like, covered with the insulating film 250, are never exposed to air. Thus, the resin film 250 has a function of preventing them from being oxidized and a function of fixing the movable switch electrodes E221 to E224 to the reference electrodes E231 to E234.

Another measure for preventing oxidation such as formation of gold plating may be applied to the surfaces of the capacitance element electrodes E201 to E205, the reference electrodes E231 to E235, and the movable switch electrodes E221 to E225. Since the insulating film 250 is formed, the capacitance element electrodes E201 to E205, the reference electrodes E231 to E235, and the movable switch electrodes E221 to E224 never come into direct contact with the displacement electrode 240.

On the upper surface of the supporting member 260, a letter print film 280 that is disposed so as to cover substantially the entire upper surface of the supporting member 260, and a disk-shaped letter print member 290 having the same outer diameter as the side button 232 are disposed concentrically with each other. The letter print film 280 is a colorless, transparent member with transparency and insulating ability. As described above, the letter print film 280 is formed integrally with the central button 231. In this embodiment, since the letter print film 280 has insulating ability and it is formed so as to cover the central button 231, in case of the central button 231 made of metal, the surface of the central button 231 can be prevented from being exposed to air and oxidized.

The letter print film 280 may be made of a non-transparent member. In this case, however, the lights emitted from the light-emitting diodes 300 can not pass toward the upper portion of the central button 231. The whole of the letter print film 280 may be lightly colored. Besides, in place of the feature that a letter or the like is printed on the upper surface of the central button 231 and the letter print film 280 is formed so as to cover the central button 231, a letter or the like may be printed on the letter print film 280 at a position corresponding to the central button 231 and the letter print film 280 may be disposed between the central button 231 and the supporting member 260.

As illustrated in FIG. 27, the letter print member 290 is a transparent member on the upper surface of which indicators for indicating the respective operation directions (movement directions of a cursor) are printed so as to correspond to the positive and negative directions of the X and Y axes, i.e., to the fixed switch electrodes E211 to E214. The shapes printed on the upper surface of the letter print member 290 may be properly changed at need into, e.g., numerals, letters, or symbols, for indicating functions. The whole of the letter print member 290 may be lightly colored. Besides, the letter print member 290 may be disposed above the side button 232.

Since the letter print film 280 and the letter print member 290 are disposed as described above, the lights emitted from the light-emitting diodes 300 disposed within the supporting member 260 are transmitted or reflected by the peripheral members, and pass through the portions of the central button 231 and the letter print member 290 other than where the symbols are printed, through the supporting member 260, the letter print film 280, the letter print member 290, and the detective member 230, upward of the detective member 230. Thus, when the central button 231 is viewed from the upper side, the symbol "+" printed on the upper surface of the central button 231 can surely be recognized. Also, when the side button 232 is viewed from the upper side, the indicators printed on the letter print member 290 for indicating the respective operation directions can surely be recognized. By this, the position and operation directions of the detective member 230 can easily be grasped. In particular, even when a device provided with the capacitance type sensor 210 is used in a dark place, an appropriate operation can be applied to the detective member 230. Besides, those have an effect of ornament.

Each symbol printed on the central button 231 and letter print member 290 may be colored into a predetermined color. Besides, only the portion of the central button 231 or letter print member 290 other than where the symbols are printed may be colored into black or a predetermined color. In this embodiment, the positional relation between the central button 231 and the letter print film 280 is inverse to the positional relation between the side button 232 and the letter print member 290. That is, the letter print film 280 is disposed above the central button 231 while the letter print member 290 is disposed below the side button 232.

This makes a difference in view between the letters or the like when the central and side buttons 231 and 232 are viewed from the upper side. That is, the letters corresponding to the side button 232 look deeper than the letter corresponding to the central button 231. Note that the positional relation between the central button 231 and the letter print film 280 may not always be inversed to the positional relation between the side button 232 and the letter print member 290.

Figure 28:
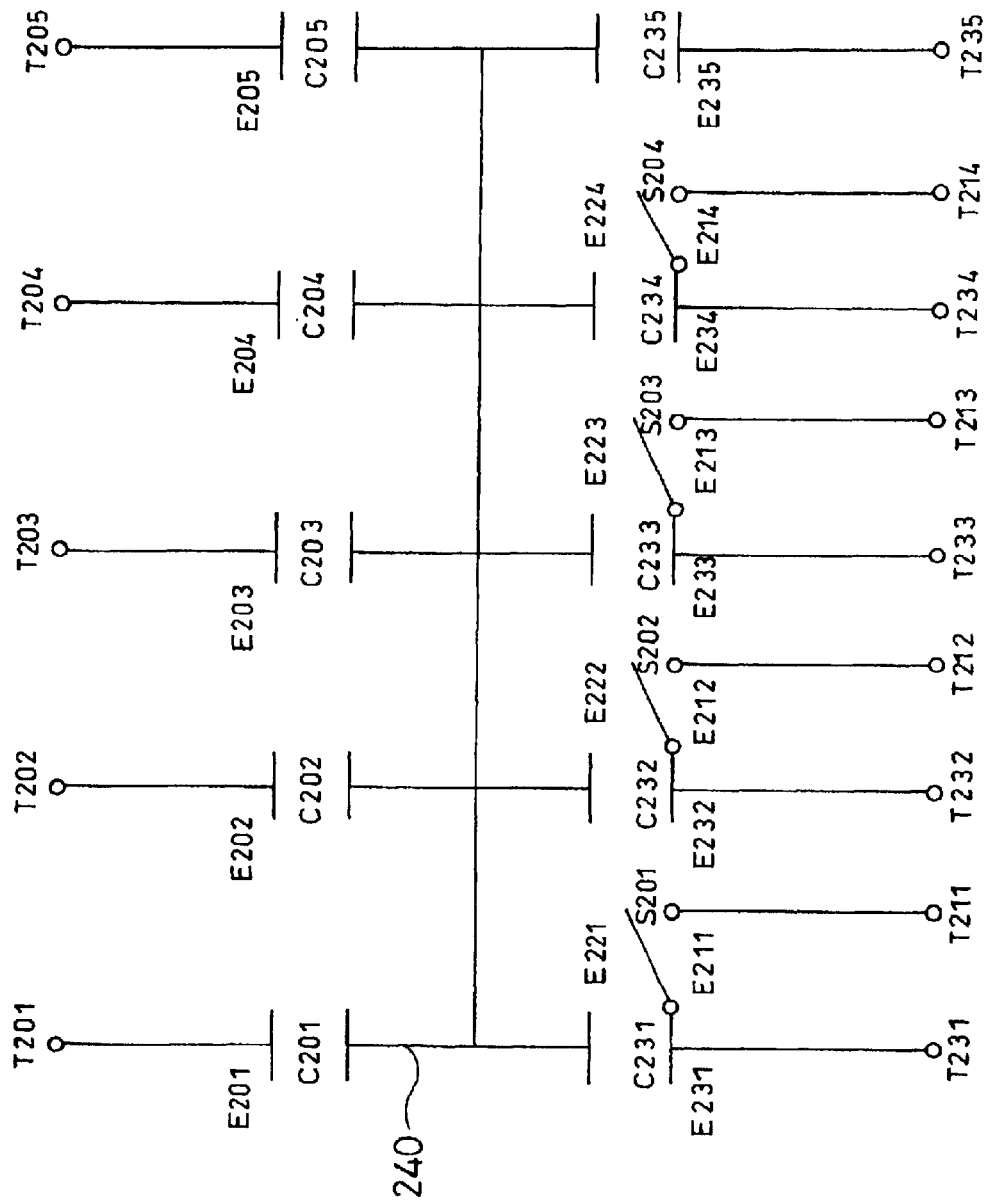
FIG. 28 is a circuit diagram equivalent to the construction of the capacitance type sensor illustrated in FIG. 24.

Next, the operation of the capacitance type sensor 210 according to this embodiment constructed as described above will be described with reference to a drawing. FIG. 28 is a circuit diagram equivalent to the construction of the capacitance type sensor illustrated in FIG. 24.

A circuit construction equivalent to the construction of the capacitance type sensor 210 will be described with reference to FIG. 28. The capacitance element electrodes E201 to E205 and the reference electrodes E231 to E235 formed on the substrate 220 are opposite to the displacement electrode 240. Capacitance elements C201 to C205 and C231 to C235 are formed between the deformable displacement electrode 240 as a common electrode and the respective fixed capacitance element electrodes E201 to E205 and reference electrodes E231 to E235. The capacitance elements C201 to C205 and C231 to C235 are variable capacitance elements whose capacitance values change due to the deformation of the displacement electrode 240.

The capacitance values of the capacitance elements C201 to C205 can be measured independently of one another as the capacitance values between the displacement electrodes 240 and the terminals T201 to T205 connected with the respective capacitance element electrodes E201 to E205. The reference electrodes E231 to E235 are grounded through the terminals T231 to T235, respectively. The displacement electrode 240 as the common electrode of the capacitance elements C201 to C205 is considered to be grounded through the capacitance elements C231 to C235 and the terminals T231 to T235. That is, the capacitance elements C231 to C235 make capacitive couplings between the displacement electrode 240 and the terminals T231 to T235.

The movable switch electrodes E221 to E224 connected with the reference electrodes E231 to E234 corresponding to the positive and negative directions of the X and Y axes can selectively take the positions in contact with the fixed switch electrodes E211 to E214 and positions not in contact with the fixed switch electrodes E211 to E214. Thus, the movable switch electrodes E221 to E224 have functions as switches S201 to S204 for connecting the reference electrodes E231 to E234 with the terminals T211 to T214 and disconnecting the former from the latter. Switch signals corresponding to the states of the switches S201 to S204 are output through the terminals T211 to T214, respectively.

Figure 29:
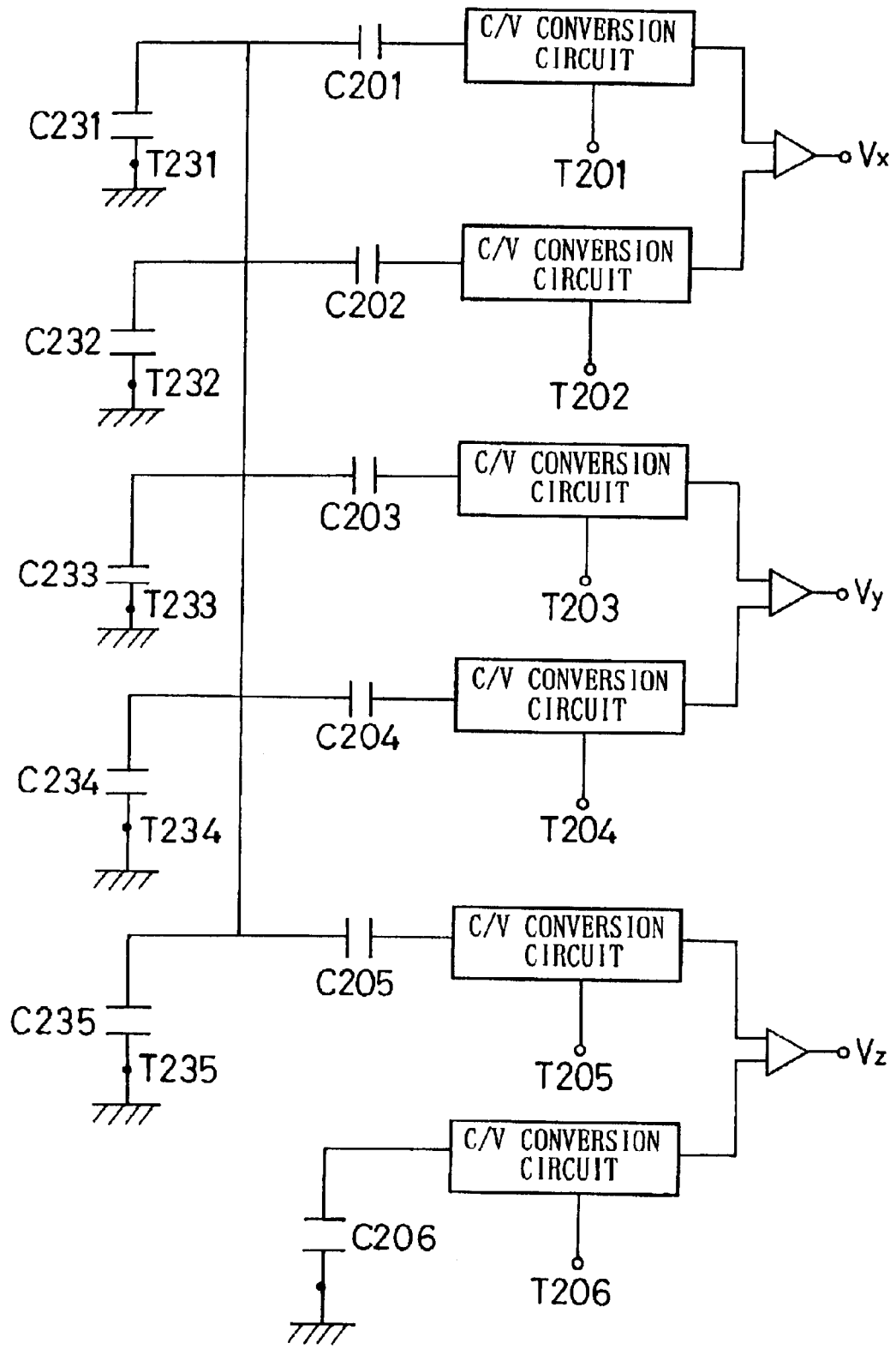
FIG. 29 is an explanatory diagram for explaining a method for deriving an output signal from a cyclic signal input to the capacitance type sensor illustrated in FIG. 24.
Figure 30:
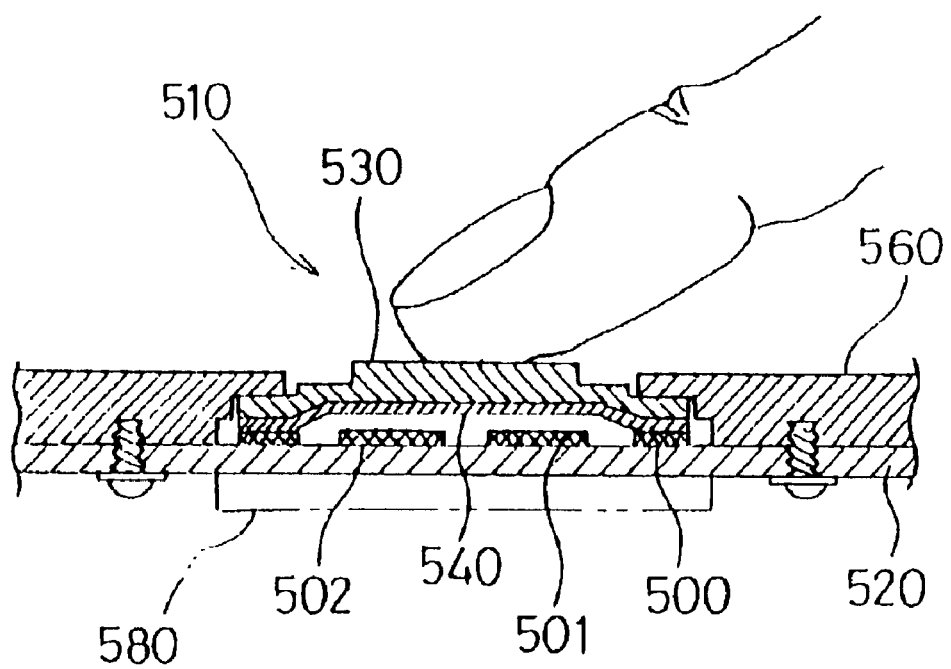
FIG. 30 is a schematic sectional view of a conventional capacitance type sensor.
Figure 31:
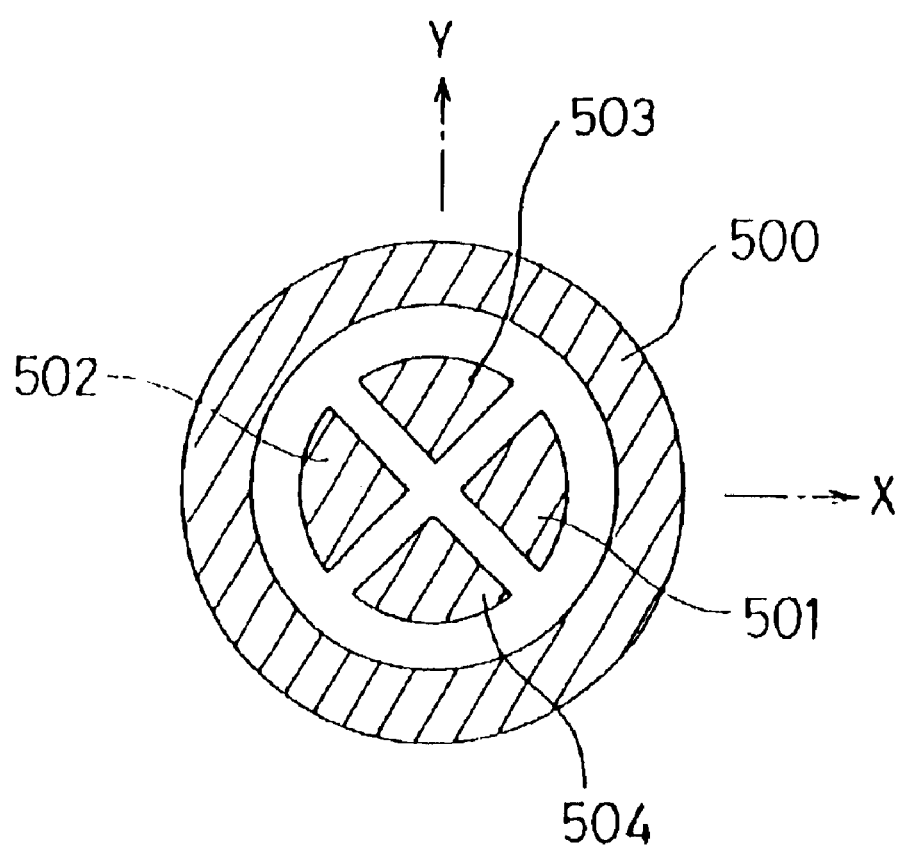
FIG. 31 is a view illustrating an arrangement of electrodes formed on a substrate of the capacitance type sensor of FIG. 30.

Next, the operation of the capacitance type sensor 210 in case of being used as a device (force sensor) for detecting the intensity of a force applied to the detective member 230 and the operation of the capacitance type sensor 10 when being used as a device having a switch function (a switch signal output device) will be described. FIG. 29 is an explanatory diagram for explaining a method for deriving an output signal from a cyclic signal input to the capacitance type sensor illustrated in FIG. 24. Note that FIG. 29 illustrates only the necessary portion for explaining the method for deriving an output signal.

The different point of the operation of the capacitance type sensor 210 from that of the capacitance type sensor 10 of FIG. 1 is that, while the central button 31 of the capacitance type sensor 10 is used as a determination operation switch, the central button 231 of the capacitance type sensor 210 is used for detecting the intensity of a force in a Z-axis direction. The other operation is the same as that described in relation to the capacitance type sensor 10 of FIG. 1, so the description thereof will be omitted.

A method for deriving an output signal indicating the intensity of an external force to the central button 231, from a change in capacitance value of the capacitance element C205, will be described with reference to FIG. 29. The output signal Vz indicates the intensity and direction of the Z-axis directional component of an external force. A capacitance element C206 is formed on the lower surface of the substrate 220 so as to always keep a fixed capacitance value. One electrode constituting the capacitance element C206 is connected with a terminal T206 and the other electrode is grounded. This capacitance element C206 is used with the capacitance element C205 for deriving the output signal Vz of the Z-axis directional component of an external force. The capacitance element C206 may be constructed using an input capacitance of a circuit pattern, an IC, or the like.

For deriving the output signals Vz, a cyclic signal such as a clock signal is always being input to each of the terminals T205 and T206. When the central button 231 receives an external force in a Z-axis direction and deforms, the displacement electrode 240 deforms accordingly. The distance of the electrodes constituting the capacitance element C205 then changes and the capacitance value of the capacitance element C205 change. This causes a difference in phase between the cyclic signals being input to the terminals T205 and T206. Using the difference in phase thus arising in the cyclic signals, the output signal Vz indicating the intensity and direction of an external force in a Z-axis direction received by the central button 231 can be obtained.

More specifically, when cyclic signals are being input to the terminals T205 and T206, a cyclic signal A is being input to the terminal T205 and another cyclic signal B different in phase from the cyclic signal A is being input to the terminal T206. In this case, when the central button 231 receives an external force in a Z-axis direction and the capacitance value of the capacitance element C205 change, a phase shift occurs in the cyclic signal A being input to the terminal T205. Since the capacitance value of the capacitance element C206 does not change, no phase shift occurs in the cyclic signal B being input to the terminal T206. Thus, a phase shift occurs only in the cyclic signal A being input to the terminal T205. The phase shift in the cyclic signal A is read by an exclusive-OR circuit or the like to derive an output signal Vz. The sign of this output signal Vz indicates whether the Z-axis directional component of the external force is positive or negative, and the absolute value indicates the intensity of the Z-axis directional component.

Incidentally, like the second embodiment, the supporting member 400 on which the deposit film 401 or print layer 402 is formed, the woven fabric 403, the non-woven fabric 404, or the film (sheet) 405 can be used as the displacement electrode 240.

As described above, in the capacitance type sensor 210 of this embodiment, since the displacement of the detective member 230 can be recognized by detecting changes in capacitance value of the capacitance elements C201 to C205 caused by changes in distances between the displacement electrode 240 and the capacitance element electrodes E201 to E205, the intensity of a force externally applied to the detective member 230 can be recognized. Besides, since it can be recognized whether or not the fixed switch electrodes E211 to E214 are in contact with the movable switch electrodes E221 to E224, this can be used as a switch. Thus, the capacitance type sensor 210 can be used as a device having a function of outputting the displacement of the detective member 230 as a signal (an analogue signal) or/and a device having a switch function. By this, the capacitance type sensor 210 has a function as a complex device that can be used as either of the aforementioned devices, and there is no necessity of remaking it to meet both applications.

Besides, in case of being used as a device having a switch function, when an operation is applied to the detective member 230, the dome-shaped movable switch electrodes E221 to E224 corresponding to the operation direction are elastically deformed with a click feeling to come into contact with the fixed switch electrodes E211 to E214. Therefore, the operator can execute the operation with having the click feeling and so he or she can easily sensually grasp the execution of the operation. Besides, since the movable switch electrodes E221 to E224 are arranged so that they can be brought into contact with the reference electrodes E231 to E234, separate wirings for the movable switch electrodes E221 to E224 need not be provided.

Besides, a plurality of capacitance electrodes E201 to E205 are formed, and components in the X-axis directions, Y-axis directions, and Z-axis directions of an external force received by the detective member 230 can be recognized independently of one another. Since signals different in phase from each other are supplied to capacitance element electrodes in a pair (E201 and E202, and E203 and E204), phase shift by passing through a circuit can be made large. Further, since a signal processing circuit utilizing a logic element is used, the signal can accurately be detected. Besides, a plurality of movable switch electrodes E221 to E224 and a plurality of fixed switch electrodes E211 to E214 are formed to correspond to the X-axis directions and Y-axis directions, they can use as switches corresponding to different directions.

The capacitance type sensor of this construction is suitably used as an input device for a personal computer, a portable telephone, games, or the like. Particularly in a portable telephone, it is very effective if the switch function can be used for performing various settings and signals for detecting a force in X- and Y-directions are used in navigation, a game, or the like.

Also, since the displacement electrode 240 is, without being in direct contact, electrically coupled with the reference electrodes E231 to E234 that are grounded through capacitive couplings by the capacitance elements C231 to C234 (each having a function of a coupling capacitor), the withstand voltage characteristic of the capacitance type sensor 210 is improved and the sensor is hardly broken due to the flow of a spark current. In addition, a bad condition in connection or the like can be prevented. Therefore, a highly reliable capacitance type sensor can be obtained. Besides, although the resin film 250 is disposed between the reference electrodes E231 to E234 and the displacement electrode 240, since there is no necessity of partially cutting the resin film 250 for bringing the reference electrodes E231 to E234 into contact with the displacement electrode 240, this is advantageous also in assembling and mounting.

Besides, since the lights emitted from the light-emitting diodes 300 pass through only the portions of the central button 231 and the letter print member 290 other than where the symbols are printed, and then reaches the detective member 230, when the detective member 230 is viewed from the outside, the symbols printed on the central button 231 and the letter print member 290 can surely be recognized. Thus, the position and operation directions of the detective member 130 can easily be grasped. In particular, even when a device provided with the capacitive type sensor 210 is used in a dark place, an appropriate operation can be applied to the detective member.

Although the preferred embodiments of the present invention have been described, the present invention is never limited to the above-described embodiments and various changes in design can be made within the scope defined by the claims. For example, in the above-described first to third embodiments, the fixed switch electrodes are formed inside the respective capacitance element electrodes. But, the present invention is not limited to this feature. The fixed switch electrodes may be formed so as to neighbor the respective capacitance element electrodes.

In the above-described first to third embodiments, the movable switch electrodes are arranged so that they can be brought into contact with the respective reference electrodes. But, the present invention is not limited to this feature. Any arrangement of the movable switch electrodes can be employed as long as they can be brought into contact with the respective fixed switch electrodes by deformation of the displacement electrode. In such a case, however, wiring for each movable switch electrode must be provided separately.

In the above-described first to third embodiments, the displacement electrode is electrically connected with the reference electrodes each of which is grounded through the capacitance element formed between the displacement electrode and the reference electrode. But, the present invention is not limited to this feature. For example, a construction can be employed in which the insulating or resin film is formed so as to be in close contact with only the capacitance element electrodes on the substrate and cover the upper surface of the substrate, and so as not to cover the reference electrodes and the movable switch electrodes. In this case, the displacement electrode may be electrically connected with the reference electrodes each of which is grounded by being brought into direct contact with the corresponding movable switch electrode. That is, any construction may be employed as long as the displacement electrode is electrically connected with the reference electrodes.

In the above-described first to third embodiments, each movable switch electrode has a dome shape. But, the present invention is not limited to this feature. Each movable switch electrode can have any shape as long as it can be brought into contact with the corresponding fixed switch electrode by deformation of the displacement electrode.

In the above-described second embodiment, the letter print member has the construction in which the through-holes (transparent regions) are formed in the non-transparent member. But, the present invention is not limited to this feature. The letter print member may have a construction in which transparent regions as windows or the like, each made of a transparent member, are formed in the non-transparent member. Further, the letter print member may have a construction in which one or more nontransparent regions with no transparency are formed on or in a transparent member.

In the above-described first to third embodiments, the detective member is formed integrally with the capacitance element electrodes and the reference electrodes, movable switch electrodes, and fixed switch electrodes. But, the present invention is not limited to this feature. The detective member may be divided so as to correspond to the respective capacitance element electrodes and the respective reference electrodes, respective movable switch electrodes, and respective fixed switch electrodes.

In the above-described first to third embodiments, the insulating or resin film is formed so as to be in close contact with some electrodes on the substrate and cover the upper surface of the substrate. But, the present invention is not limited to this feature. Such an insulating or resin film may not be formed.

In the above-described second and third embodiments, the displacement electrode is transparent. But, the present invention is not limited to this feature. The displacement electrode may not always be transparent. In case of using a non-transparent displacement electrode, part of the light emitted from each light-emitting diode passes through the interior of the transparent supporting member (the supporting member serves as a light-introducing board), and thereby it is introduced to the detective member. In case of using a thick supporting member and a large-area detective member, however, the displacement electrode is preferably transparent. Incidentally, even in case of the transparent displacement electrode, it may not always be transparent in relation to their all surfaces (all directions). It suffices if the displacement electrode is transparent perpendicularly to the displacement electrode (along the Z-axis in drawings).

In the above-described second and third embodiments, a light-emitting diode is used as a light source. But, the present invention is not limited to this feature. Any other light source may be used. Besides, the constructions in which a light source is disposed within the supporting member has been described. But, the present invention is not limited to this feature. The light source can be disposed at any position that allows the light source to emit a light toward the detective member.

In the above-described first to third embodiments, the detective member is formed integrally with the capacitance element electrodes corresponding to the X-axis and Y-axis directions. But, the present invention is not limited to this feature. The detective member may be divided so as to correspond to the respective capacitance element electrodes corresponding to the X-axis and Y-axis directions.

In the above-described first to third embodiments, the capacitance element electrodes are formed corresponding to the four directions of the positive and negative directions of the X- and Y-axes. But, the present invention is not limited to this feature. One or more capacitance element electrodes may be formed so as to be able to detect only the necessary directional components in each application.

What is claimed is:

1. A capacitance type sensor comprising:
   a substrate for determining an XY plane in a defined XYZ three-dimensional coordinate system;
   a detective member being opposite to said substrate;
   a conductive member disposed between said substrate and said detective member, said conductive member being displaceable in a Z-axis direction as said detective member is displaced in a Z-axis direction;
   a reference electrode formed on said substrate and electrically connected with said conductive member, said reference electrode being grounded or kept at a fixed potential;
   a first electrode formed on said substrate;
   a second electrode formed on said substrate to constitute a first capacitance element with said conductive member; and
   a third electrode disposed at a distance from said first electrode so that said third electrode can be brought into contact with said first electrode as said conductive member is displaced, wherein:
      the displacement of said detective member on the basis of a detection, using a signal input to said second electrode, of a change in capacitance value of said first capacitance element caused by a change in distance between said conductive member and said second electrode, and a judgment as to whether said first and third electrodes are in contact with each other, can both be recognized, and
      during the displacement of said detective member toward said conductive member, said conductive member starts to displace toward said second electrode before said first and third electrodes are brought into contact with each other.

2. The capacitance type sensor according to claim 1, wherein said third electrode is in contact with said reference electrode.

3. The capacitance type sensor according to claim 1, wherein said third electrode is elastically deformed as said conductive member is displaced.

4. The capacitance type sensor according to claim 1, wherein a second capacitance element is formed between said reference electrode and said conductive member.

5. The capacitance type sensor according to claim 1, wherein a plurality of electrode sets each constituted by a reference electrode as said reference electrode, a first electrode as said first electrode, a second electrode as said second electrode, and a third electrode as said third electrode, are provided.

6. The capacitance type sensor according to claim 1, wherein two electrode sets each constituted by a reference electrode as said reference electrode, a first electrode as said first electrode, a second electrode as said second electrode, and a third electrode as said third electrode, are provided, and cyclic signals different in phase from each other are respectively input to a circuit including one of said electrode sets and a circuit including the other of said electrode sets.

7. The capacitance type sensor according to claim 1, wherein two electrode sets each constituted by a reference electrode as said reference electrode, a first electrode as said first electrode, a second electrode as said second electrode, and a third electrode as said third electrode, are provided, and a CR circuit including one of said electrode sets is different in time constant from a CR circuit including the other of said electrode sets.

8. The capacitance type sensor according to claim 1, wherein two electrode sets each constituted by a reference electrode as said reference electrode, a first electrode as said first electrode, a second electrode as said second electrode, and a third electrode as said third electrode, are provided, and output signals as a result of cyclic signals respectively input to a circuit including one of said electrode sets and a circuit including the other of said electrode sets are detected by a signal processing circuit using a logic element.

9. The capacitance type sensor according to claim 8, wherein said logic element performs an exclusive-OR operation.

10. The capacitance type sensor according to claim 8, wherein said logic element performs an OR operation.

11. The capacitance type sensor according to claim 8, wherein said logic element performs an AND operation.

12. The capacitance type sensor according to claim 8, wherein said logic element performs an AND operation and a NOT operation.

13. The capacitance type sensor according to claim 1, wherein said detective member has been divided so as to correspond to the respective groups of said reference electrode, said first electrode, and said third electrode, and said second electrode.

14. The capacitance type sensor according to claim 1, wherein said second electrode includes a pair of fourth electrodes disposed symmetrically in relation to the Y axis, and a pair of fifth electrodes disposed symmetrically in relation to the X-axis.

15. The capacitance type sensor according to claim 14, wherein said detective member has been divided so as to correspond to said fourth electrodes and said fifth electrodes.

16. The capacitance type sensor according to claim 1, further comprising:
   a sixth electrode formed on said substrate; and
   a seventh electrode disposed at a distance from said sixth electrode so that said seventh electrode can be elastically deformed to be brought into contact with said sixth electrode, as said conductive member is displaced.

17. The capacitance type sensor according to claim 16, wherein said detective member has been divided so as to correspond to said second electrode and said sixth electrode.

18. The capacitance type sensor according to claim 1, wherein said detective member is covered with an insulating member.

19. The capacitance type sensor according to claim 1, further comprising:

a light source disposed on said substrate; and a filmy member having a transparent region and a non-transparent region, and wherein said detective member is transparent.

20. The capacitance type sensor according to claim 19, wherein said conductive member is transparent.

21. The capacitance type sensor according to claim 19, further comprising a colored member with transparency disposed between said light source and said detective member.

22. The capacitance type sensor according to claim 19, wherein said detective member is covered with a transparent insulating member.

\* \* \* \* \*